(12) United States Patent
Kubo

(10) Patent No.: US 7,116,128 B2
(45) Date of Patent: Oct. 3, 2006

(54) SEMICONDUCTOR DEVICE WITH BUS TERMINATING FUNCTION

(75) Inventor: Takashi Kubo, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/212,743

(22) Filed: Aug. 29, 2005

(65) Prior Publication Data

US 2006/0017456 A1 Jan. 26, 2006

Related U.S. Application Data

(63) Continuation of application No. 10/391,021, filed on Mar. 19, 2003.

(30) Foreign Application Priority Data

Oct. 23, 2002 (JP) .............................. 2002-307961

(51) Int. Cl.
*H03K 17/16* (2006.01)
(52) U.S. Cl. .......................................... 326/30; 326/87
(58) Field of Classification Search .................. 326/30, 326/32, 38, 83, 87
See application file for complete search history.

(56) References Cited

U.S. PATENT DOCUMENTS

| | | | |
|---|---|---|---|
| 4,859,877 A | 8/1989 | Cooperman et al. | |
| 5,023,488 A | 6/1991 | Gunning | |
| 5,438,281 A | 8/1995 | Takahashi et al. | |
| 5,726,583 A | 3/1998 | Kaplinsky | |
| 5,949,252 A | 9/1999 | Taguchi | |
| 6,054,881 A * | 4/2000 | Stoenner | 327/112 |
| 6,239,619 B1 | 5/2001 | Yuan et al. | |
| 6,331,787 B1 | 12/2001 | Whitworth et al. | |
| 6,501,108 B1 | 12/2002 | Suzuki et al. | |
| 6,714,039 B1 | 3/2004 | Salcido et al. | |
| 6,720,795 B1 | 4/2004 | Partow et al. | |
| 6,754,132 B1 | 6/2004 | Kyung | |
| 6,759,874 B1 * | 7/2004 | Braun et al. | 326/87 |
| 6,768,393 B1 | 7/2004 | Song | |
| 6,777,976 B1 * | 8/2004 | Kuge | 326/30 |
| 6,809,546 B1 | 10/2004 | Song et al. | |
| 6,853,213 B1 * | 2/2005 | Funaba | 326/30 |
| 6,924,669 B1 * | 8/2005 | Itoh et al. | 326/87 |
| 6,927,600 B1 * | 8/2005 | Choe | 326/30 |
| 6,967,500 B1 * | 11/2005 | Lin et al. | 326/30 |
| 2005/0007150 A1 | 1/2005 | Omote | |
| 2005/0194991 A1 * | 9/2005 | Dour et al. | 326/30 |

FOREIGN PATENT DOCUMENTS

| | | |
|---|---|---|
| EP | 0 818 734 A2 | 1/1998 |
| JP | 3-238858 A | 10/1991 |
| JP | 5-224790 A | 9/1993 |
| JP | 5-225358 | 9/1993 |
| JP | 5-326846 A | 12/1993 |
| JP | 07-086509 | 3/1995 |

(Continued)

*Primary Examiner*—Linh Nguyen
(74) *Attorney, Agent, or Firm*—McDermott Will & Emery LLP

(57) ABSTRACT

The distance between a drain contact and gate electrode in a terminating transistor, which couples a termination resistor connected to an output terminal to a power source node, is set shorter than in an output transistor, which drives an output node in accordance with an internal signal. The area of the terminating circuit is reduced while the reliability against the surge is maintained. Thus, an output circuit containing the terminating circuit that occupies a small area and is capable of transmitting a signal/data at high speed is provided.

11 Claims, 17 Drawing Sheets

FOREIGN PATENT DOCUMENTS

| | | |
|---|---|---|
| JP | 7-086509 A | 3/1995 |
| JP | 07-130947 | 5/1995 |
| JP | 7-130947 A | 5/1995 |
| JP | 8-17936 A | 1/1996 |
| JP | 8-204539 A | 8/1996 |
| JP | 10-20974 A | 1/1998 |
| JP | 10-65744 | 3/1998 |
| JP | 10-65744 A | 3/1998 |
| JP | 11-214621 | 8/1999 |
| JP | 11-214621 A | 8/1999 |
| JP | 2000-49251 A | 2/2000 |
| JP | 2000-338191 A | 12/2000 |
| JP | 2000-349165 A | 12/2000 |
| JP | 2001-36073 A | 2/2001 |
| JP | 2001-127173 | 5/2001 |
| JP | 2001-127173 A | 5/2001 |
| JP | 2002-9281 A | 1/2002 |
| WO | WO 03/049291 A1 | 6/2003 |

* cited by examiner

SEMICONDUCTOR DEVICE WITH BUS TERMINATING FUNCTION

RELATED APPLICATIONS

This application is a continuation of application Ser. No. 10/391,021 filed Mar. 19, 2003, which claims priority of Japanese Application No. 2002-307961, filed Oct. 23, 2002, the contents of which are hereby incorporated by reference.

BACKGROUND OF THE INVENTION

1. Field of the Invention

The present invention relates to a semiconductor device driving an output node, and specifically, to a semiconductor device with a bus terminating function.

2. Description of the Background Art

In a semiconductor device, a transistor connected to a pin terminal is easy to be affected by noises, since it is directly connected to the outside of the device via the pin terminal. Among the noises, one at a level enough to destruct a device (a transistor) is referred to as a surge. A destruction of a semiconductor device by the surge is referred to as electro-static damage (ESD), which is accompanied by breakdown of a gate insulating film of an MOS transistor (insulated gate field effect transistor) and others. Therefore, for the reliability of the semiconductor device, the breakdown voltage enough to withstand the surge is required.

For an input pin receiving an external signal, usually, an input protection circuit is configured by a diode or a diode-connected MOS transistor (insulated gate field effect transistor), or a field transistor with a sufficiently thick gate insulating film. By this input protection circuit, the surge is caused to flow to a power supply terminal or a ground terminal, and thus transmission of the surge to the internal circuitry is prevented.

The protection circuit is not required for an output circuit, since an output transistor serves as a surge absorbing transistor. However, in an MOS output circuit configured with an MOS transistor, a large current may flow into the output transistor or high electric field may be generated at drain due to the surge voltage, which may result in electrostatic damage. In order to reduce the current and the drain electric field for avoiding such electrostatic damage, the resistance value of drain region (hereinafter referred to as a drain diffusion resistance) in the output transistor must be increased. Usually, in order to increase the drain resistance, the distance between the gate of the output transistor and a drain contact for connecting to the output node is required to be sufficiently long. Consequently, the diffusion region area of the drain portion in the output transistor increases, and hence, the size of the output transistor increases.

An arrangement for preventing electrostatic damage with limited area of the output circuit is proposed in Japanese Patent Laying-Open No. 2001-127173. According to this first prior art document, drain diffusion region is made different in impurity concentration from source diffusion region, to have an increased drain diffusion resistance value.

In a second prior art document, Japanese Patent Laying-Open No. 11-214621, an arrangement is disclosed in which a terminating resistance element and a protection element for this terminating resistance element are provided between an output transistor and an output pad. According to this second prior art document, the electrostatic protection element is formed of an MOS transistor, and in order to increase the resistance of the drain region, i.e., drain diffusion resistance, the distance between gate and drain contact of the MOS transistor is made longer. Taking advantage of this large drain diffusion region area, the terminating resistance element is arranged above the drain region of the electrostatic protection element in order not to increase the layout area of the entire output circuit. The terminating resistance element is a current limiting resistance element for avoiding a reflecting wave such as a ringing in signal transmission, and is connected between the output pad and the output node (drain) of the output transistor.

In a third prior art document, Japanese Patent Laying-Open No. 10-65744, an arrangement is disclosed in which impedance switching means is provided between an output terminal and an output circuit. The impedance switching means is set to a low impedance state in transmission and to a high impedance state in reception, to reduce reflection noises due to capacitive load of transmission path.

According to the arrangement shown in the first prior art document, the impurity concentrations of source and drain in the output transistor must be made different, and hence, the number of manufacturing steps increases. The drain diffusion resistance is continuously connected to an external bus via the pin terminal. If the drain diffusion resistance functions as terminating resistance, then an output signal is driven via high drain diffusion resistance in signal outputting, and thus the signal can not be transmitted at high speed.

According to the arrangement disclosed in the second prior art document, the protection circuit for the terminating resistance element is arranged corresponding to the output circuit. The distance between a drain contact and a gate electrode of the MOS transistor of the protection circuit is large enough to place the terminating resistor thereabove. Accordingly, the interface area between the drain region and the substrate region is made large, and a large drain junction capacitance of this protection circuit is connected to the output pin terminal. Consequently, the parasitic capacitance of the output pin terminal increases, and thus, a signal can not be transmitted at high speed. Further, since the terminating resistance element is connected between the drain of the output transistor and the output pad and functions as a current limiting element for an output signal, the signal can not be output at high speed. Moreover, since the terminating resistance causes a voltage drop, a signal at CMOS level can not be transmitted.

According to the arrangement disclosed in the third prior art document, the impedance switching means is provided for the output pin terminal, which has the impedance switched between a transmission mode and a reception mode. In this case also, however, a protection element against the surge must be provided, which increases the occupying area of the circuit for switching the termination resistance value in accordance with the operation mode. Especially, if the circuit portion for controlling this termination resistance is formed with a transistor having an increased drain diffusion resistance, then the load of the output pin increases accordingly. Thus, a signal can not be transmitted at high speed, and the occupying area of the output circuit increases further. In the third prior art document, the consideration is only given to suppress the ringing in signal transmission and reception, and an arrangement for reducing the output circuit area and for alleviating the load of the transmission path is not considered.

Each of U.S. Pat. No. 6,809,546 B2 and US 2004/0032319 A1 discloses an on-chip termination circuit formed of series connection of a termination resistor and a MOS transistor, but fails to show the specific layout of the termination circuit as in the present application.

SUMMARY OF THE INVENTION

An object of the present invention is to provide a semiconductor device capable of transferring a signal accurately at high speed, without increase in circuit area and degradation in reliability.

Another object of the present invention is to provide a semiconductor circuit device with an output circuit containing a terminating circuit, which is capable of transferring a signal of CMOS level at high speed with small occupying area and high reliability.

A semiconductor device according to the present invention includes a first output transistor driving an output node in accordance with an internal signal, a first resistance element having one end connected to the output node, and a first terminating transistor element connected between another end of the first resistance element and a first power supply node and selectively made conductive in accordance with an operation mode designating signal. The distance between a control electrode and a contact of one conduction terminal in the first terminating transistor is shorter than in the first output transistor.

By arranging the terminating circuit inside the semiconductor device, a signal can be transmitted through selective operation of the terminating circuit while maintaining the impedance matching to the bus, even when the system configuration is modified. Therefore, a signal can be transmitted at high speed with no adverse effect by an interconnection line impedance or others.

Additionally, by setting the drain contact-to-gate (control electrode) length in the terminating transistor shorter than in the output transistor, the area will not be increased despite of placing the terminating circuit. Further, by placing the terminating resistance element, the breakdown voltage against the surge of the terminating transistor can be assured. Thus, a reliable semiconductor device with a small occupying area, having an output circuit that is capable of transmitting a signal at high speed can be implemented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
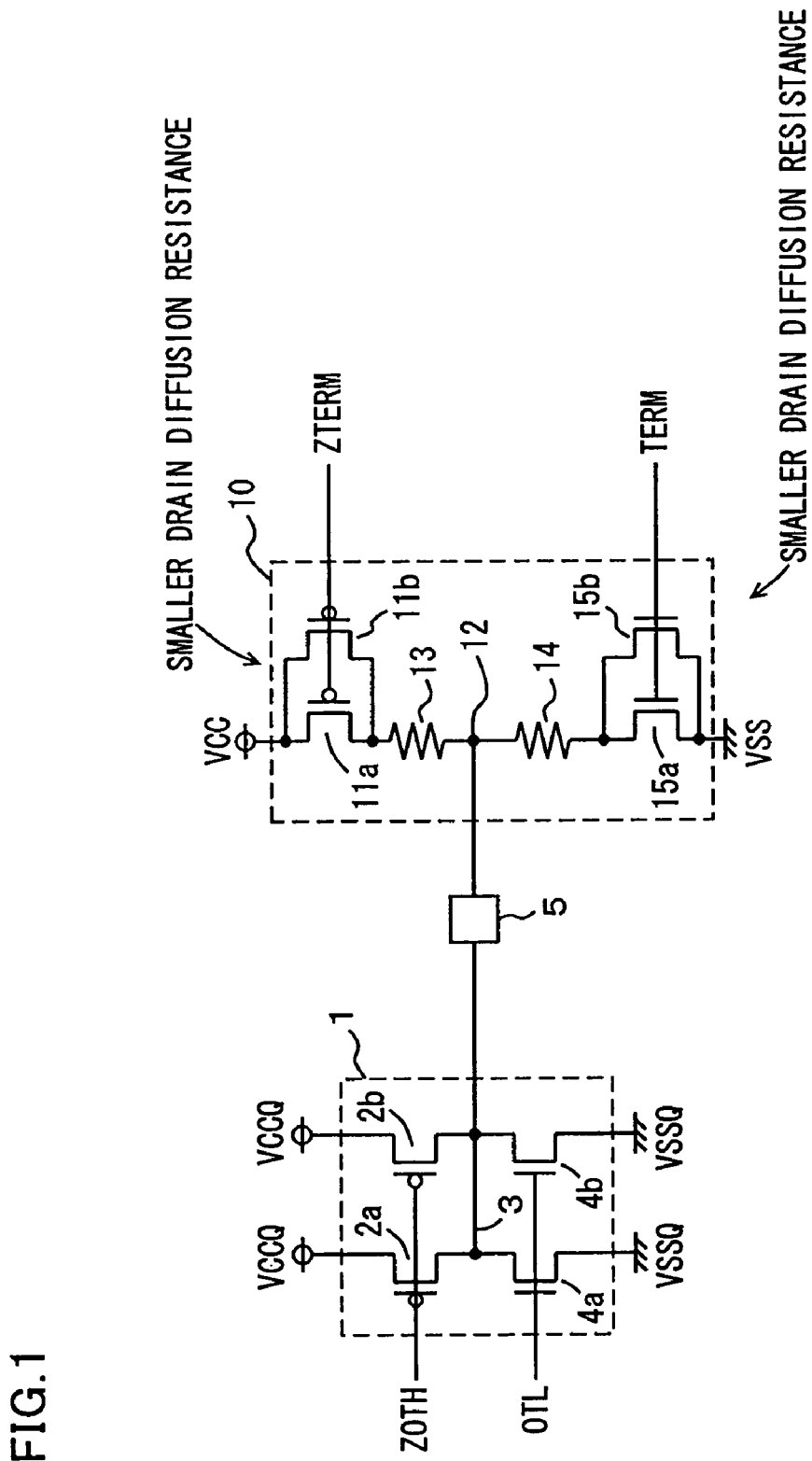
FIG. 1 shows the configuration of a semiconductor device according to a first embodiment of the present invention.

FIG. 1 shows a configuration of a main part of a semiconductor device according to a first embodiment of the present invention. In FIG. 1, an output circuit 1 and a terminating circuit 10 provided for an external output pad 5 are representatively shown. Pad 5 is connected to a pin terminal, which is not shown.

Output circuit 1 includes P-channel MOS transistors 2a and 2b each connected between a power supply node and an output node 3 and selectively made conductive in accordance with an output control signal ZOTH, and N-channel MOS transistors 4a and 4b each connected between output node 3 and a ground node and selectively made conductive in accordance with an output control signal OTL. Power supply voltage VCCQ for the output circuit is supplied to the power supply node, and ground voltage VSSQ for the output circuit is supplied to the ground node. Output node 3 is connected to output pad 5.

The logic levels of output control signals ZOTH and OTL are set in accordance with an operating condition of output circuit 1 and an internal signal. When output control signal ZOTH is at H level (logical high level) and output control signal OTL is at L level (logical low level), MOS transistors 2a, 2b, 4a and 4b are all in an off state (non-conductive state), and output circuit 1 is set to an output high impedance state. In this output high impedance state, output circuit 1 is in standby state. When output control signals ZOTH and OTL are both at H level, MOS transistors 2a and 2b are both in off state while MOS transistors 4a and 4b are both in on state (conductive state), and output node 3 is driven to ground voltage VSSQ level.

When output control signals ZOTH and OTL are both at L level, MOS transistors 2a and 2b are both in on state while MOS transistors 4a and 4b are both in off state. Responsively, output node 3 is driven to power supply voltage for output circuit, or output power supply voltage VCCQ level.

In operation of output circuit 1, output control signals ZOTH and OTL are generated in accordance with an internal signal. The internal signal is internal read data when the semiconductor device shown is applied to a memory device, and based on the internal data and a read operation timing control signal, these output control signals ZOTH and OTL are generated.

Two MOS transistors 2a and 2b, or two MOS transistors 4a and 4b are arranged in parallel for the following reasons.

These MOS transistors 2a, 2b, 4a, and 4b are each configured with unit MOS transistors, and using a plurality of unit transistors, required driving power is provided to output circuit 1. Therefore, the number of pull-down N-channel MOS transistors for discharging the output and the number of pull-up P-channel transistors for charging the output are determined as appropriate in accordance with a power required for driving external pad 5 and the current drivability of the unit MOS transistor.

Terminating circuit 10 includes a resistance element 13 having one end connected to an output node 12, P-channel MOS transistors 11a and 11b connected between another end of resistance element 13 and a power supply node and receiving a termination control signal ZTERM at their gates, a resistance element 14 having one end connected to an output node 12, and N-channel MOS transistors 15a and 15b connected between the other end of resistance element 14 and a ground node and receiving a termination control signal TERM at their gates.

Voltages VCC and VSS applied to terminating circuit 10 are supplied from a power supply terminal different from that applying voltages VCCQ and VSSQ to output circuit 1. By applying operation power supply voltages VCCQ and VSSQ dedicatedly to output circuit 1, the operation of output circuit 1 can be stabilized, or the power supply noise in an output operation is prevented from being transmitted to other circuits. Voltages VCC and VSS applied to terminating circuit 10 may be supplied from the common power supply terminal that applies voltages VCCQ and VSSQ to output circuit 1. Further, voltages VCC and VCCQ may be at the same voltage level, or may be at different voltage levels.

Termination control signals ZTERM and TERM are control signals complementary to each other. When activating the terminating operation of terminating circuit 10, termination control signal ZTERM is set at L level and termination control signal TERM is set at H level. When deactivating the terminating operation of terminating circuit 10, termination control signal ZTERM is set at H level and termination control signal TERM is set at L level.

As in output circuit 1, in terminating circuit 10 as well, two MOS transistors 11a and 11b at H level side and two MOS transistors 15a and 15b at L level side are arranged, for forming these termination control P- and N-channel switching MOS transistors each with a plurality of unit MOS transistors.

In terminating circuit 10, MOS transistors 11a and 11b are connected to output node 12 via resistance element 13, while MOS transistors 15a and 15b are connected to output node 12 via resistance element 14. Output node 12 is connected to output pad 5. Therefore, MOS transistors 11a, 11b, 15a, and 15b for termination control are not necessarily required to comply with the drain contact-to-gate distance requirement that is specified to assure the reliability against electrostatic damage, and that is the requirement for output MOS transistors 2a, 2b, 4a, and 4b directly connected to the output pin. Accordingly, the drain contact-to-gate distances of MOS transistors 11a and 11b are set shorter than those of MOS transistors 2a and 2b, or the drain contact-to-gate distances of MOS transistors 15a and 15b are set shorter than those of MOS transistors 4a and 4b. By shortening the drain contact-to-gate distance, the drain resistance is reduced, and hence, the layout area of the drain region of each of terminating transistors 11a, 11b, 15a, and 15b is reduced.

The relationship between termination control signals TERM and ZTERM, and output control signals ZOTH and OTL for terminating circuit 10 are not specifically determined. The terminating operation of terminating circuit 10 may be activated in a signal/data output operation of output circuit 1. Further, such an arrangement may be employed that the terminating operation of terminating circuit 10 is deactivated in a signal/data output operation of output circuit 1 and a terminating circuit of another circuit connected to a signal bus, not shown, is activated. Still further, where the pad 5 is further connected to a signal input pin and therefore to a not shown input circuit, the terminating operation of terminating circuit 10 may be deactivated or activated in a signal input operation.

The activation period of the terminating operation of terminating circuit 1 may be set in accordance with the condition of a load connected to an external bus.

Therefore, activation/deactivation timing and period of termination control signals TERM and ZTERM needs only to be determined as appropriate in accordance with the termination control condition of the bus of the system to which the semiconductor circuit device is applied.

Figure 2:
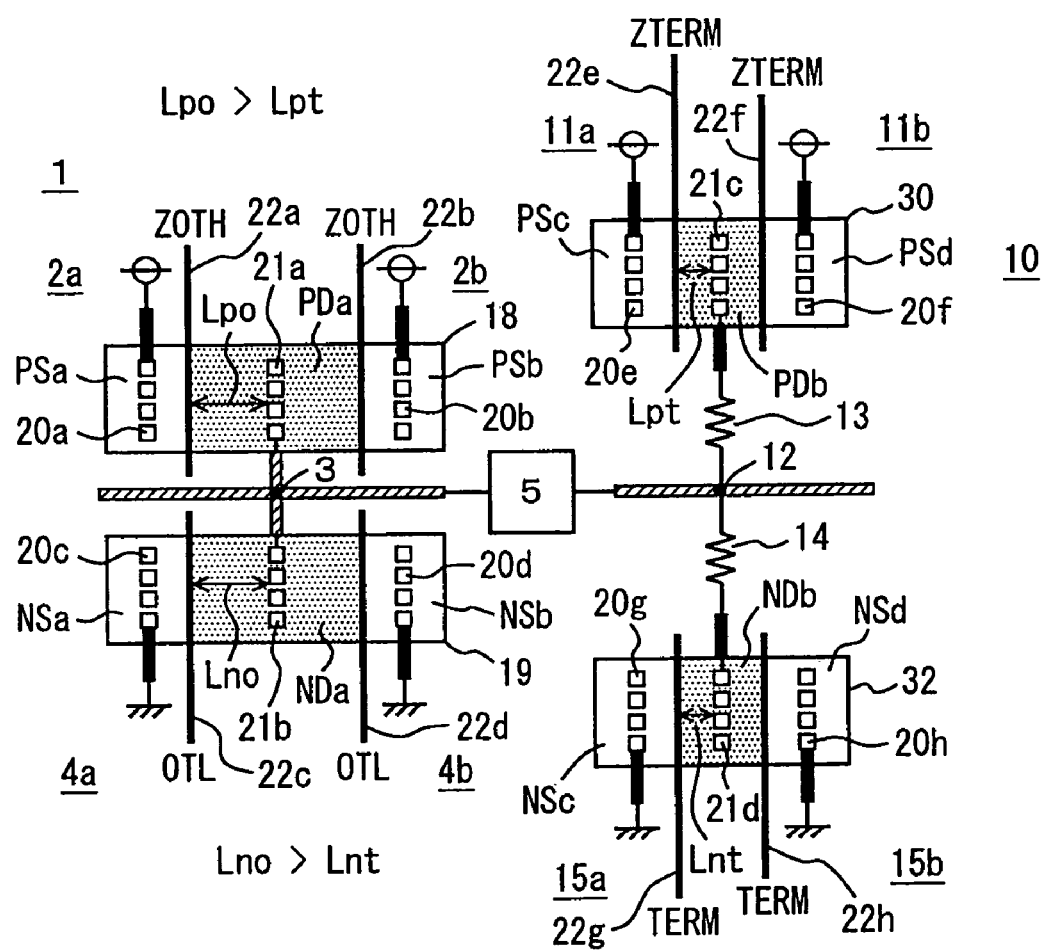
FIG. 2 schematically shows the two dimensional layout of the semiconductor device shown in FIG. 1.

FIG. 2 shows the two-dimensional layout of MOS transistors in output circuit 1 and terminating circuit 10 shown in FIG. 1. In FIG. 2, MOS transistors 2a and 2b of output circuit 1 are formed in a rectangular active region 18, and output MOS transistors 4a and 4b are formed in a rectangular active region 19 arranged facing to active region 18.

Active region 18 includes a drain impurity region PDa formed in the middle portion, and source impurity regions PSa and PSb formed at opposing sides thereof. A gate electrode 22a is arranged between drain impurity region PDa and source impurity region PSa, and a gate electrode 22b is arranged between drain impurity region PDa and source impurity region PSb. Drain impurity region PDa is shared by transistors 2a and 2b. Output control signal ZOTH is commonly applied to these gate electrodes 22a and 22b.

Source impurity regions PSa and PSb are connected to power supply nodes via source contacts 20a and 20b, respectively. Drain impurity region PDa is connected to output node 3 via drain contact 21a. The distance between drain contact 21a and gate electrode 22a is Lpo. Similarly, although not shown explicitly, the distance between drain contact 21a and gate electrode 22b of MOS transistor 2b is also Lpo.

In active region 19 also, an N-type drain impurity region NDa is arranged in the middle portion, and at opposing sides thereof, N-type source impurity regions NSa and NSb are arranged. A gate electrode 22c is arranged between N-type source impurity region NSa and N-type drain impurity region NDa, and a gate electrode 22d is arranged between drain impurity region NDa and source impurity region NSb. Drain impurity region NDa is shared by MOS transistors 4a and 4b. Drain impurity region NDa is connected to output node 3 via drain contact 21b. The distance between drain contact 21b and gate electrode 22c is Lno. Similarly, though not shown explicitly in FIG. 2, the distance between drain contact 21b and gate electrode 22b is also Lno. Source impurity regions NSa and NSb are electrically connected to ground nodes via source contacts 22c and 22d, respectively.

In terminating circuit 10, terminating MOS transistors 11a and 11b are formed in P-type active region 30, while MOS transistors 15a and 15b are formed in N-type active region 32. In P-type active region 30, a drain impurity region PDb is formed in the middle portion, and at opposing sides thereof, source impurity regions PSc and PSd are formed. A gate electrode 22e is provided between drain impurity region PDb and source impurity region PSc, and gate electrode 22f is arranged between drain impurity region PDb and source impurity region PSd.

Impurity region PDb is shared by MOS transistors 11a and 11b. Drain impurity region PDb is connected to the other end of resistance element 13 via drain contact 21c. Source impurity regions PSc and PSd are electrically connected to power supply nodes via source contacts 20e and 20f, respectively. The distance between drain contact 21c and gate electrode 22e is Lpt, and the distance between drain contact 21c and gate electrode 22f is also Lpt. In FIG. 2, drain contact-to-gate distance of MOS transistor 11a is indicated.

In N-type active region 32, an N-type drain impurity region NDb is formed at the middle portion, and at opposing sides thereof, N-type source impurity regions NSc and NSd are arranged. A gate electrode 22g is arranged between N-type source impurity region NSc and N-type drain impurity region NDb, and a gate electrode 22h is arranged between N-type drain impurity region NDb and N-type source impurity region NSd. Source impurity regions NSc and NSd are electrically connected to ground nodes via source contacts 20g and 20h, respectively. Drain impurity region NDb is connected to the other end of resistance element 14 via drain contact 21d. Resistance elements 13 and 14 each have the one end connected to node 12. The distance from drain contact 21d to gate electrodes 22g and to 22h of MOS transistor 15a and 15b, respectively, is Lnt.

The drain contact-to-gate electrode distance Lpo of MOS transistors 2a and 2b is longer than the drain contact-to-gate electrode distance Lpt of MOS transistors 11a and 11b. The drain contact-to-gate electrode distance Lno of MOS transistors 4a and 4b is longer than the drain contact-to-gate electrode distance Lnt of MOS transistors 15a and 15b.

If drain impurity regions PDa and PDb are the same in impurity concentration, and if drain impurity regions NDa and NDb are the same in impurity concentration, then shorter drain contact-to-gate electrode distance results in smaller drain resistance. In this case, the electric field relaxation by resistance elements 13 and 14 can compensate for the reduction of drain resistance of MOS transistors 11a, 11b, 15a and 15b in terminating circuit 10.

Terminating resistance elements 13 and 14 may be configured with diffusion resistance, or may be configured with polysilicon resistance.

As shown in FIG. 2, the length of P-type active region 30 in horizontal direction in FIG. 2 is shorter than P-type active region 18 by at least 2·(Lpo−Lpt). Similarly, the length of N-type active region 32 in horizontal direction is shorter than N-type active region 19 by at least 2·(Lno−Lnt). Therefore, in terminating circuit 10, the occupying area of active regions 30 and 32 can be reduced, as compared to the case of the countermeasure against the electrostatic damage similar to that for MOS transistor 2a, 2b, 4a, and 4b in output circuit 1. Accordingly, the occupying area of terminating circuit 10 can be reduced, and thus to suppress the increase in occupying area of the semiconductor circuit device including this output circuit and terminating circuit 10. The relaxation of electric field/current at drain in terminating transistor 11a, 11b, and 15a, 15b is achieved by resistance elements 13 and 14, respectively, and thus the electrostatic damage of terminating transistors 11a, 11b, 15a, and 15b can be prevented.

Further, by using terminating circuit 10, a signal can be transmitted at high speed via pad 5, while maintaining impedance matching with the bus.

In the arrangement shown in FIG. 2, the drain contact-to-gate electrode distance satisfies the following relation:

Lpo>Lpt, Lno>Lnt

However, the following conditional relation may be satisfied as well:

Lpo>Lpt, Lno>Lpt,

Lpo>Lnt, and Lno>Lnt.

In the arrangement shown in FIG. 2, with output transistors 2a, 2b, 4a, and 4b each comprised of a unit transistor, the output circuit 1 is constructed, and similarly in terminating circuit 10, MOS transistors 11a, 11b, 15a, and 15b each comprised of a unit transistor are employed for constructing pull-up and pull-down terminating transistors. However, in accordance with the load of pad 5, the output control transistor or the termination control transistor may be formed using three or more unit transistors. Increasing the numbers of unit transistors employed, the effect of area saving achieved by the decreased drain contact-to-gate electrode distance will be more significant.

First Modification

Figure 3:
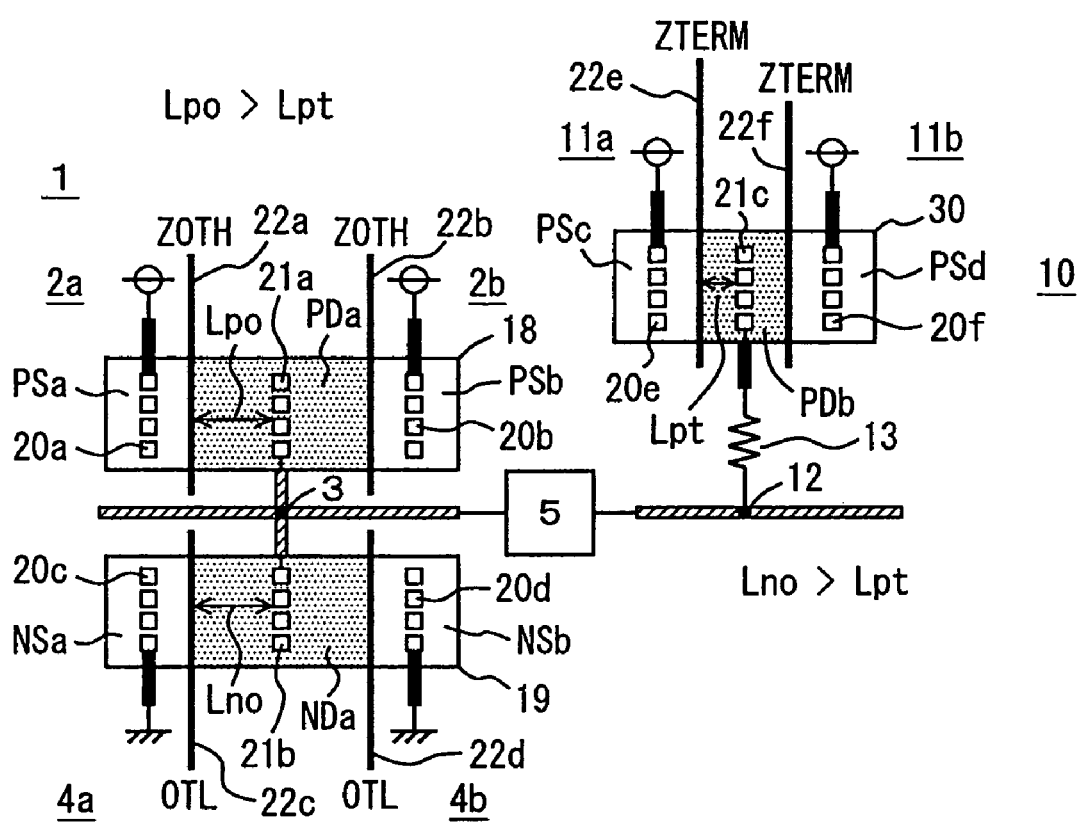
FIG. 3 schematically shows the two dimensional layout of a first modification of the first embodiment of the present invention.

FIG. 3 schematically shows a layout of transistors in output circuit 1 and terminating circuit 10 according to a first modification of the first embodiment of the present invention. The layout of the semiconductor circuit device shown in FIG. 3 is different from that of FIG. 2 in the following points. No pulling-down termination circuit portion is provided in terminating circuit 10. Terminating resistance element 13 and P-type active region 30 forming P-channel MOS transistors 11a and 11b are provided. In P-type active region 30, the distances Lpt from drain contact 21c to gate electrode 22e and to gate electrode 22f, respectively, are set sufficiently shorter as compared with the corresponding distance Lpo of P-channel MOS transistors included in output circuit 1. In this case, the distance Lpt is set shorter than the drain contact-to-gate electrode distance Lno of N-channel MOS transistors of output circuit 1.

The other configuration of the circuit layout shown in FIG. 3 is the same as that shown in FIG. 2, therefore corresponding parts are denoted by identical reference numerals or characters and detailed description thereof will not be repeated.

In the arrangement shown in FIG. 3, the configuration of output circuit 1 is identical to the configuration shown in FIG. 2. In terminating circuit 10, since pulling-down resistance element and N-channel MOS transistors are not provided, the occupying area of terminating circuit 10 as well as the parasitic capacitance associated with node 12 can be decreased, allowing output circuit 1 to drive pad 5 at high speed.

Figure 4:
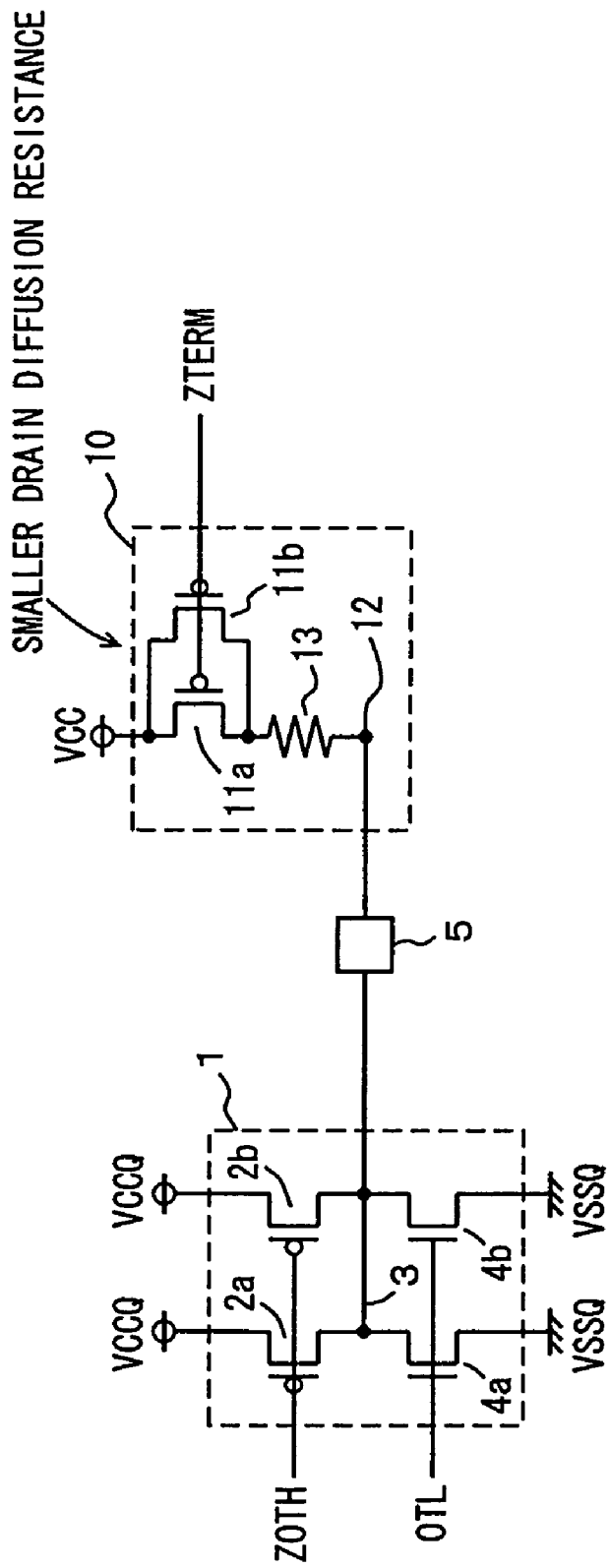
FIG. 4 shows an electric equivalent circuit of the layout shown in FIG. 3.

FIG. 4 shows an electric equivalent circuit of the configuration shown in FIG. 3. As shown in FIG. 4, in terminating circuit 10, resistance element 13 has one end connected to node 12, and between this resistance element 13 and power supply node, P-channel MOS transistors 11a and 11b receiving termination control signal ZTERM at their gates are connected.

Output circuit 1 includes, similarly to the configuration shown in FIG. 1, pulling-up transistors 2a and 2b, and pulling-down transistors 4a and 4b.

Terminating circuit 10 can perform the terminating operation at high speed on node 12 with reduced parasitic capacitance, owing to the small drain diffusion resistance of MOS transistors 11a and 11b and absence of pull-down transistors 15a and 15b. The terminating operation condition is the same as described above referring to FIG. 1 and determined as appropriate in accordance with the bus termination condition of the system involved.

Further, in terminating circuit 10, since drain junction capacitances of MOS transistors 15a and 15b shown in FIG. 1 will not be coupled to pad 5 via resistance element 13, the load of pad 5 can be reduced, allowing output circuit 1 to drive the pad 5 at high speed.

The configuration of output circuit 1 is the same as the configuration of output circuit 1 shown in FIG. 1, and pad 5 is driven via output node 3 in accordance with output signals ZOTH and OTL.

In termination control circuit 10 shown in FIG. 3, in pulling-down operation, pad 5 is pulled up to power supply voltage VCC level. The termination voltage VCC may be the same voltage as voltage VCCQ of output circuit 1, or may be applied from a different power supply terminal. Further, the voltages VCC and VCCQ may be at the same voltage level or may be at different voltage levels. Terminating circuit 10 may be configured only with a pulling-down circuit that drives the pad 5 to ground voltage level in the terminating operation (i.e., may be configured with resistance element 14 and MOS transistors 15a and 15b).

Second Modification

Figure 5:
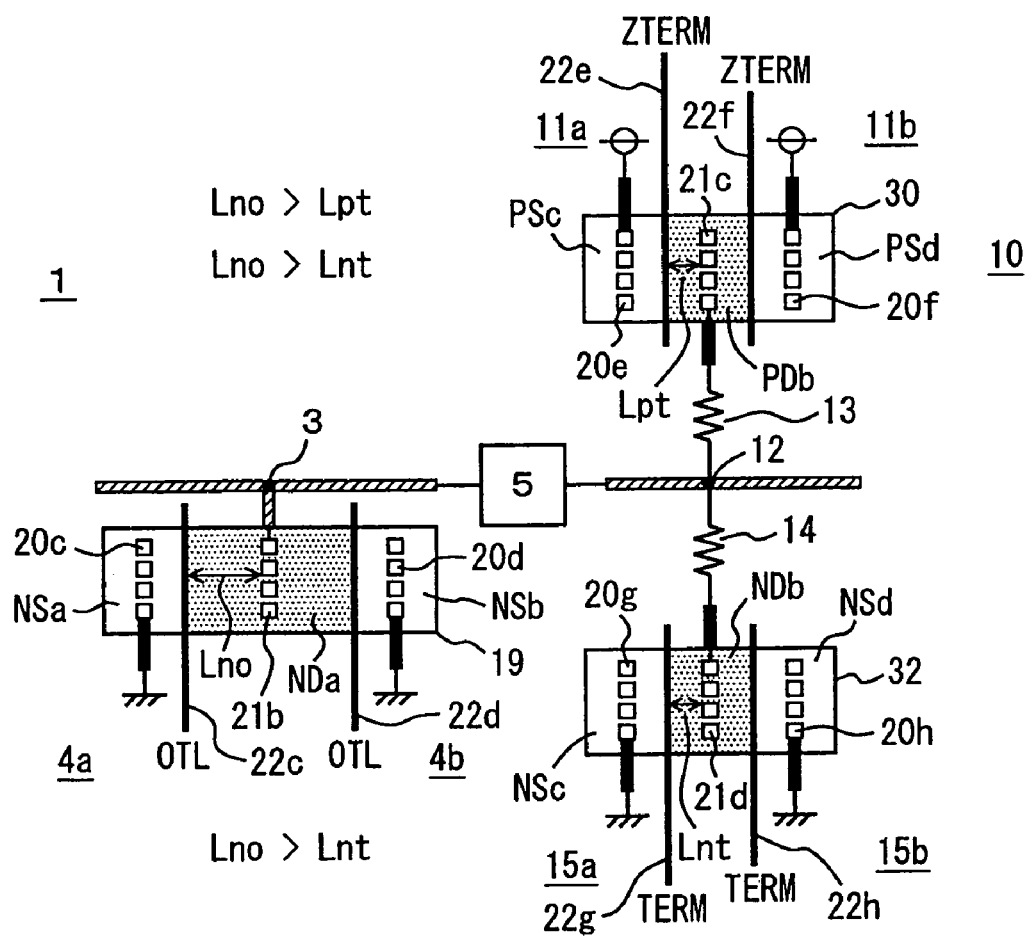
FIG. 5 schematically shows the two dimensional layout of a second modification of the first embodiment of the present invention.

FIG. 5 schematically shows the layout of an output circuit and a terminating circuit according to a second modification of the first embodiment of the present invention. The layout shown in FIG. 5 is different from the layout shown in FIG. 2 in the following points. P-type active region 18 is not arranged, but an N-type active region 19 is arranged in output circuit 1. The distance between drain contact 21b and gate electrode 22c in N-type active region 19 is set to Lno. Source impurity regions NSa and NSb are coupled to ground nodes via source contacts 20c and 20d, respectively.

In output circuit 1, MOS transistors 4a and 4b are arranged to drive output node 3 in accordance with output control signal OTL applied to gate electrodes 22c and 22d. Accordingly, the output circuit 1 drives the external signal line via output pad 5, according to the open-drain scheme.

The configuration of terminating circuit 10 is similar to the layout of terminating circuit 10 shown in FIG. 2, therefore identical reference numerals or characters are allotted to corresponding parts, and detailed description thereof will not be repeated.

In the configuration shown in FIG. 5, the drain contact-to-gate electrode distances Lpt of P-channel MOS transistors 11a and 11b included in terminating circuit 10 are set shorter than the gate electrode-to-drain contact distances Lno of N-channel MOS transistors 4a and 4b included in output circuit 1. Similarly, drain contact-to-gate electrode distances Lnt of N-channel MOS transistors 15a and 15b are set shorter than the drain contact-to-gate electrode distances Lno of N-channel MOS transistors 4a and 4b included in output circuit 1.

This output circuit 1 includes only the circuit of open-drain scheme, which pulls down output node 3 in accordance with output control signal OTL. To output node 3, only the pulling-down N-channel MOS transistors are connected, thus the load of output node 3 is reduced and the pad 5 can be driven at high speed.

Figure 6:
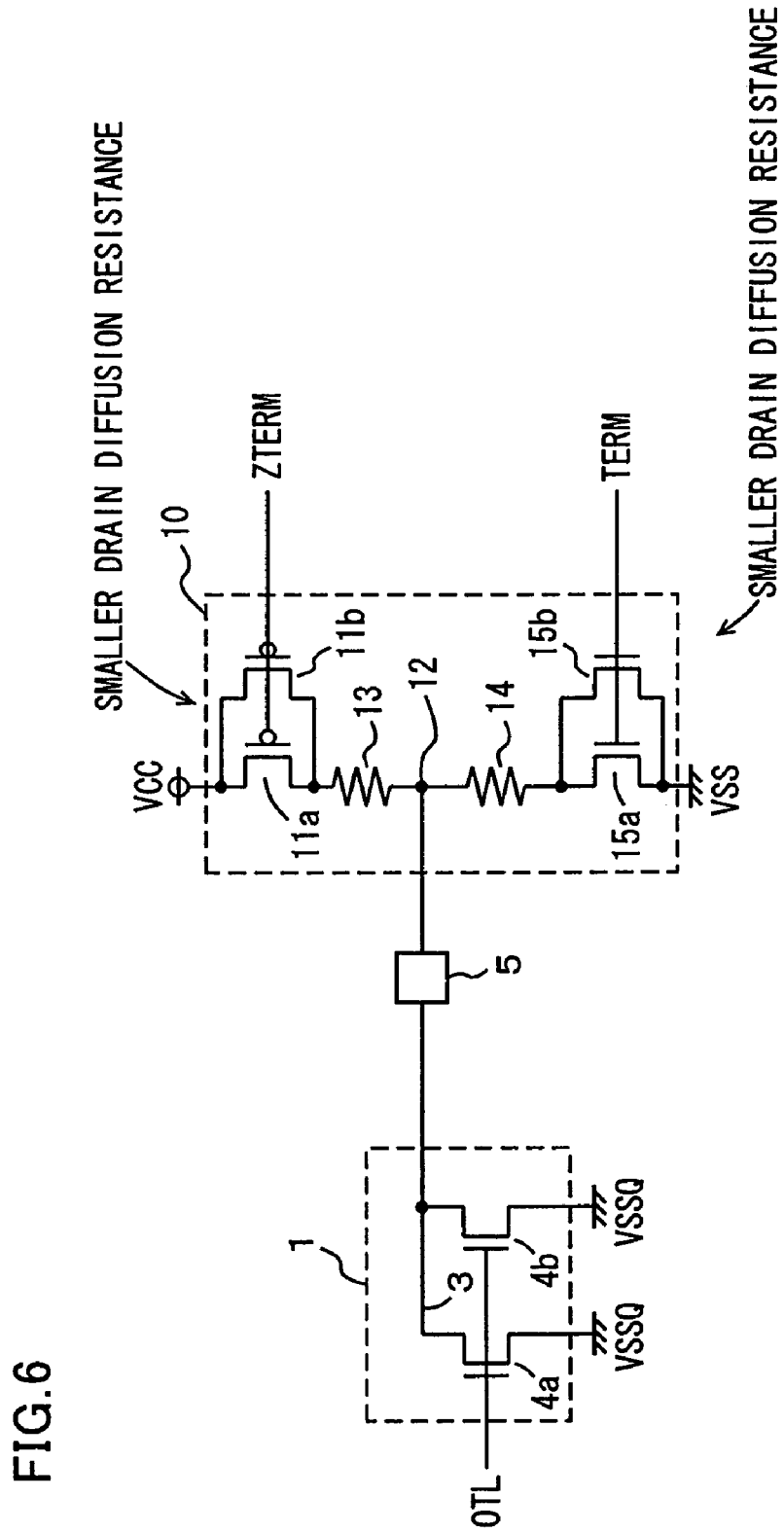
FIG. 6 shows an electric equivalent circuit of the layout shown in FIG. 5.

FIG. 6 shows an electric equivalent circuit of the configuration shown in FIG. 5. Referring to FIG. 6, in output circuit 1, N-channel MOS transistors 4a and 4b receiving output control signal OTL at their gates are arranged in parallel between output node 3 and ground nodes. The circuit configuration of the terminating circuit 10 is the same as terminating circuit 10 shown in FIG. 1. Terminating transistors 11a, 11b, 15a and 15b, as well as terminating resistors 13 and 14 are provided.

After output pad 5 is driven to ground voltage VSSQ level by output circuit 1 in accordance with output control signal OTL, the pad 5 can be precharged to power supply voltage VCC level again, using terminating circuit 10. Additionally, since the output circuit of open-drain scheme is employed, the load of output circuit 1 is reduced, and thus an output signal can be generated at high speed.

In the configuration of open-drain scheme output circuit 1 also, in terminating circuit 10, the gate electrode-to-drain contact distance of each of the MOS transistors included therein is set short and thus the occupying area of terminating circuit 10 is sufficiently small. Therefore, an output signal can be generated at high speed accurately while suppressing the increase in circuit occupying area.

Third Modification

Figure 7:
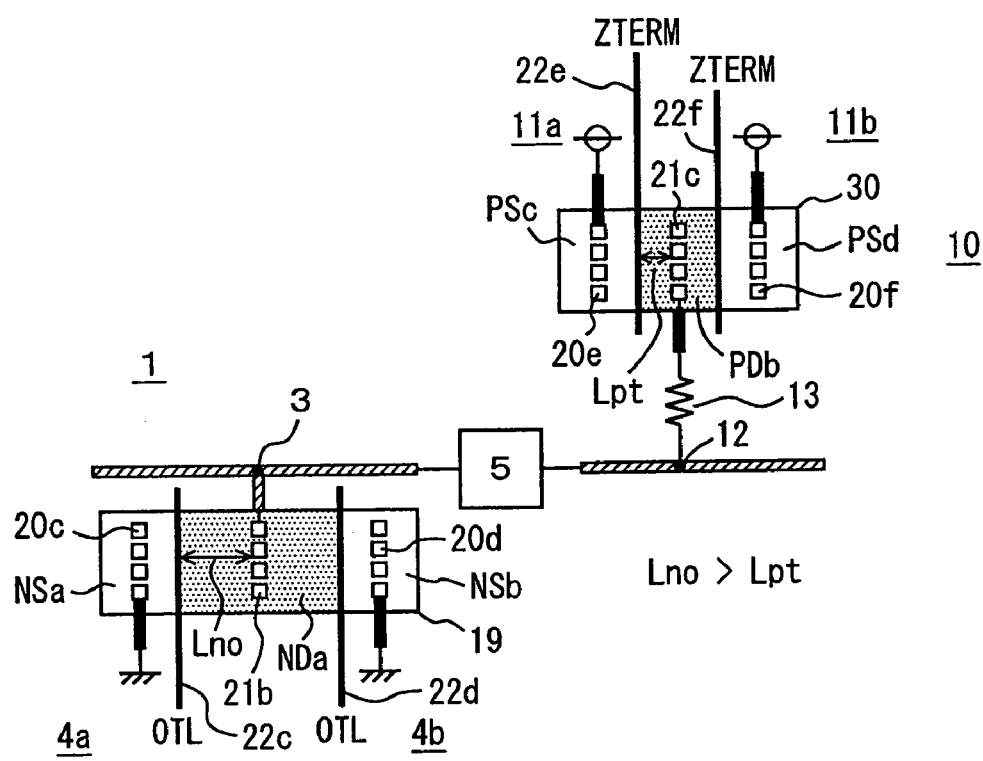
FIG. 7 schematically shows the two dimensional layout of a second modification of the first embodiment of the present invention.

FIG. 7 schematically shows a layout of a third modification of the semiconductor device according to the first embodiment of the present invention. The layout of the semiconductor device shown in FIG. 7 is different from the layout of the semiconductor device shown in FIG. 5 in the following points. Resistance element 14 and N-type active region 32 are not provided in terminating circuit 10 and resistance element 13 and P-type active region 30 are provided. Specifically, P-channel MOS transistors 11a and 11b terminating at power supply voltage level are provided in terminating circuit 10. The distances Lpt from drain contact 21c to gate electrodes 22e and 22f of P-channel MOS transistors 11a and 11b, respectively, are set shorter than the drain contact-to-gate electrode distances Lno of N-channel MOS transistors included in output circuit 1. Source impurity regions PSc and PSd are connected to power supply nodes via source contacts 20e and 20f, respectively.

Similarly, in output circuit 1, source impurity regions NSa and NSb in N active region 19 are connected to ground nodes via source contacts 20c and 20d, respectively. Specifically, in output circuit 1, similarly to the configuration shown in FIG. 5, N-channel MOS transistors 4a and 4b are provided, but pulling-up P-channel MOS transistors are not provided.

In the configuration shown in FIG. 7, pad 5 is driven to ground voltage level by N-channel MOS transistors 4a and 4b in accordance with open-drain scheme, and pad 5 is terminated at power supply voltage level.

In the configuration of terminating circuit 10 and output circuit 1 shown in FIG. 7, output pad 5 is driven in open-drain scheme, and terminating circuit 10 terminates output pad 5 to power supply node at appropriate timing in accordance with the bus condition. The loads on output pad 5 are only the drain junction capacitances and the interconnection line capacitances of active regions 19 and 30, and the drain junction capacitances of N-channel MOS transistors in terminating circuit 10 are eliminated, and thus, output pad 5 is driven at higher speed.

Figure 8:
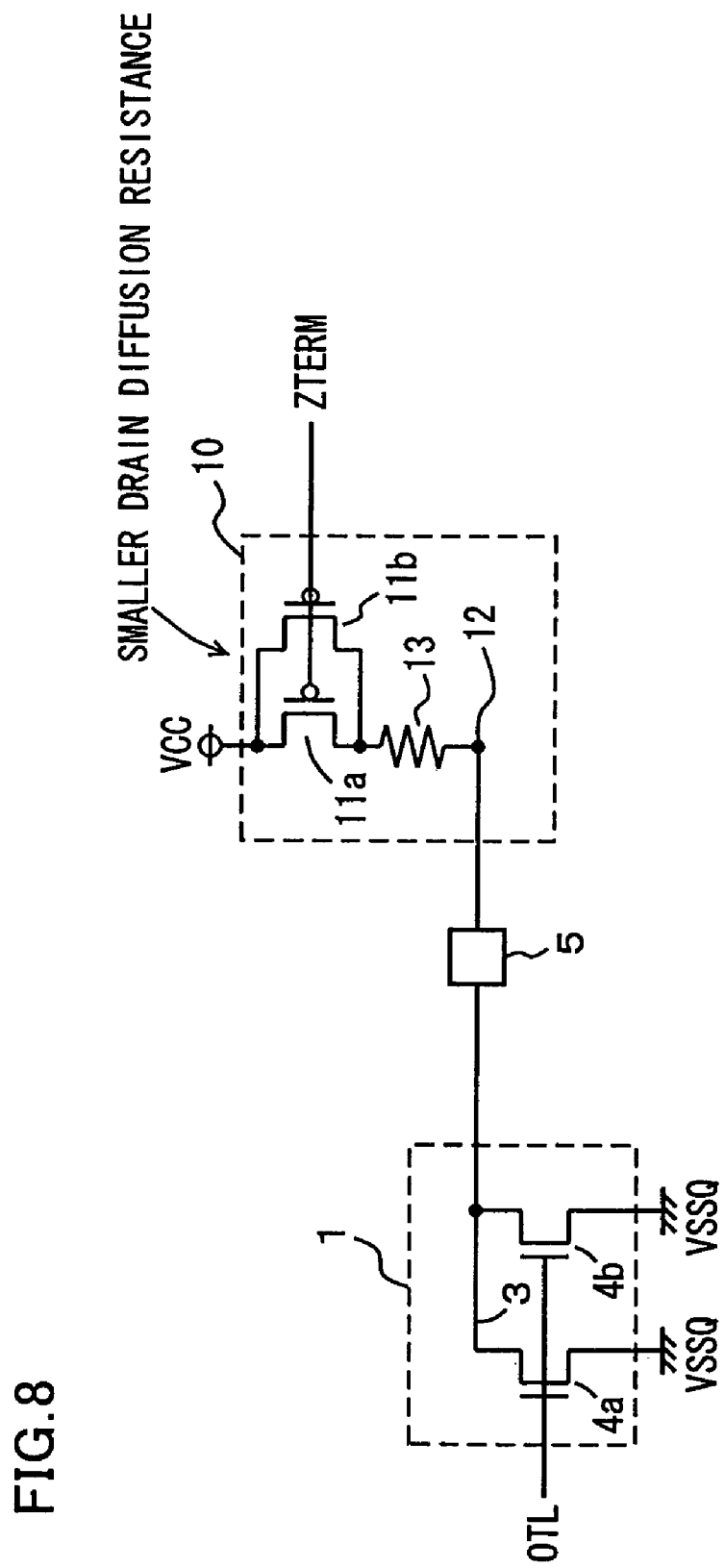
FIG. 8 shows an electric equivalent circuit of the layout shown in FIG. 7.

FIG. 8 shows an electric equivalent circuit of the semiconductor device shown in FIG. 7. Referring to FIG. 8, in terminating circuit 10, there are arranged resistance element 13, and P-channel MOS transistors 11a and 11b that selectively connect resistance element 13 to power supply node in accordance with termination control signal ZTERM.

In output circuit 1, N-channel MOS transistors 4a and 4b are connected in parallel, which drive output node 3 to ground voltage VSSQ level in accordance with output control signal OTL. Therefore, by driving output pad 5 in the open-drain scheme and by terminating the pad 5 at power supply voltage VCC level, the load of pad 5 is reduced and a signal can be transmitted at high speed. Power supply voltage VCC applied to terminating circuit 10 may be power supply voltage VCCQ, or may be a different voltage.

In this case also, the drain contact-to-gate electrode distance Lpt of each of terminating P-channel MOS transistors 11a and 11b is set sufficiently shorter than the drain contact-to-gate electrode distance Lno of each of N-channel MOS transistors 4a and 4b of output circuit 1, whereby the occupying area of terminating circuit 10 is made sufficiently small.

In general, an output pad is driven to ground voltage VSSQ level in the open-drain scheme. Alternatively, a pulling-up transistor for performing a pulling up to power supply voltage level in accordance with an output control signal may be provided in output circuit 1, while a transistor performing a termination at ground voltage level may be provided in terminating circuit 10.

Where both of a P-channel MOS transistor and an N-channel MOS transistor are used in output circuit 1, the drain contact-to-gate electrode distance Lpo of P-channel transistor and the drain contact-to-gate electrode distance Lno of N-channel transistor may not be made equal to each other. Additionally, where both of a P-channel MOS transistor and a N-channel MOS transistor are used in terminating circuit 10, the drain contact-to-gate electrode distance Lpt and the drain contact-to-gate electrode distance Lnt thereof may not be equal to each other.

The minimum requirement is that the drain contact-to-gate electrode distance of the MOS transistor in the terminating circuit is shorter than the drain contact-to-gate electrode distance of the MOS transistor in the output circuit, and the layout area of such terminating MOS transistors is sufficiently smaller than that of output MOS transistors.

As above, according to the first embodiment of the present invention, the drain contact-to-gate electrode distances of terminating MOS transistors are set shorter than those of output MOS transistors. Accordingly, the layout area of terminating circuit can be reduced sufficiently as compared to a configuration with conventional protection mechanism against electrostatic damage, and thus the occupying area of signal output portion can be reduced.

Further, since the terminating circuit is provided in a semiconductor device, the bus termination condition can be optimized in accordance with the bus utilization condition, and thus a signal/data can be transmitted accurately at high speed, while maintaining bus impedance matching.

Second Embodiment

Figure 9:
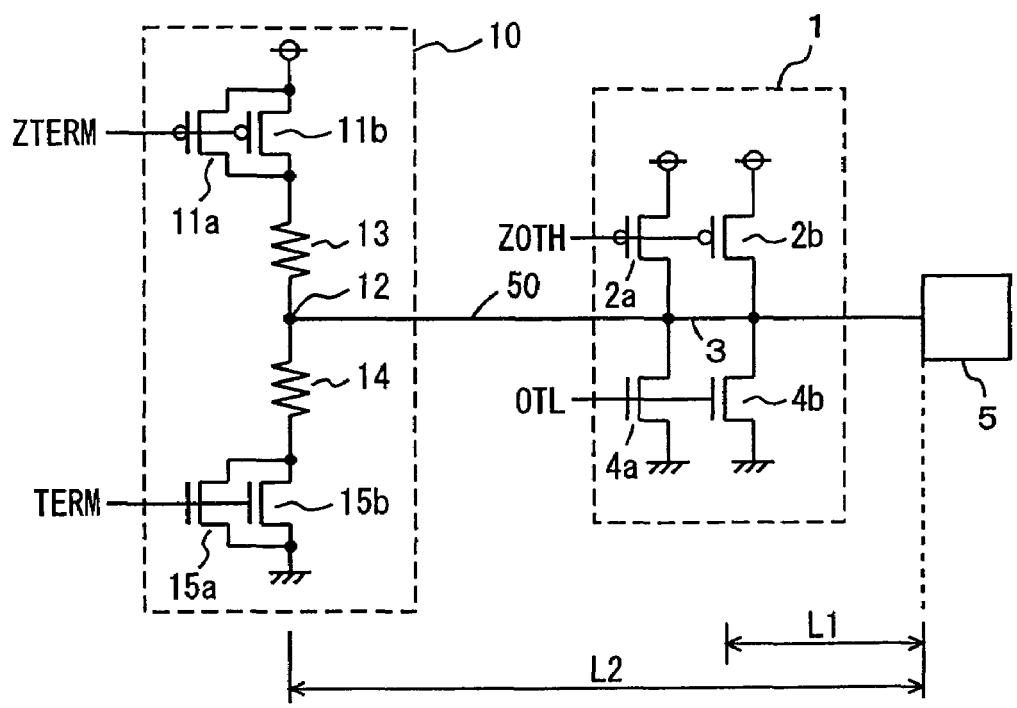
FIG. 9 shows the configuration of a semiconductor device according to a second embodiment of the present invention.

FIG. 9 schematically shows a configuration of an output circuit and a terminating circuit according to a second embodiment of the present invention (hereinafter, both of the circuits are collectively referred to as a semiconductor device). In the configuration shown in FIG. 9, output node 3 of output circuit 1 is electrically connected to pad 5 via interconnection line 50. Terminating circuit 10 is provided distant from pad 5 relative to output circuit 1. A terminating node 12 of terminating circuit 10 is connected to the same interconnection line 50. Terminating node 12 of terminating circuit 10 and output node 3 of output circuit 1 are electrically connected to pad 5 via common interconnection line 50.

Similarly to the first embodiment, output circuit 1 includes pulling up P-channel MOS transistors 2a and 2b, and pulling down N-channel MOS transistors 4a and 4b, which drive output node 3 in accordance with output control signals ZOTH and OTL, respectively.

Similarly to the first embodiment, terminating circuit 10 includes, as its components, resistance elements 13 and 14, P-channel MOS transistors 11a and 11b that are selectively made conductive in accordance with termination control signal ZTERM, and N-channel MOS transistors 15a and 15b that are selectively made conductive in accordance with termination control signal TERM.

The operations of terminating circuit 10 and output circuit 1 are the same as in the first embodiment, and the logic level of termination control signals ZTERM and TERM for terminating circuit 10 is set in accordance with the termination condition of an external bus connected to pad 5 and the operation of output circuit 1.

In the configuration shown in FIG. 9, termination node 12 of terminating circuit 10 and output node 3 of output circuit 1 are connected to pad 5 via common interconnection line 50. This interconnection line 50 extends from pad 5 to terminating circuit 10 via output circuit 1. Therefore, a distance L2 between termination node 12 of terminating circuit 10 and pad 5 is made longer than a distance L1 between output node 3 of output circuit 1 and pad 5.

In operation, output circuit 1 and terminating circuit 10 drive the pad 5 via common interconnection line 50. In output circuit 1, input capacitance to pad 5 exists due to the interconnection line and junction capacitances of MOS transistors 2a, 2b, 4a and 4b. Additionally, there exists a line resistance in interconnection line 50. Accordingly, a low pass filter is formed by the parasitic capacitance and the interconnection line resistance in a path from pad 5 to terminating circuit 10 via interconnection line 50. Even though a surge is generated at pad 5, the steep surge is mitigated by the parasitic low pass filter and then transmitted to terminating circuit 10.

In output circuit 1, MOS transistors 2a, 2b, 4a, and 4b each have the drain contact-to-gate electrode distance set sufficiently long to have large drain resistance, and therefore the reliability against surge is assured. In terminating circuit 10, the surge is mitigated by the parasitic low pass filter formed by output circuit 1 and interconnection line 50, and then transmitted. Therefore, in terminating circuit 10, the requirement of assuring reliability against the surge for MOS transistors 11a, 11b, 15a, and 15b is further relaxed. When the surge is sufficiently mitigated by resistance elements 13 and 14 and the parasitic low pass filter, the drain contact-to-gate electrode distances of MOS transistors 11a, 11b, 15a, and 15b in terminating circuit 10 can be shortened down to the limitation in designing, i.e., to the minimum design size, and thus the occupying area of terminating circuit 10 can be reduced.

Figure 10:
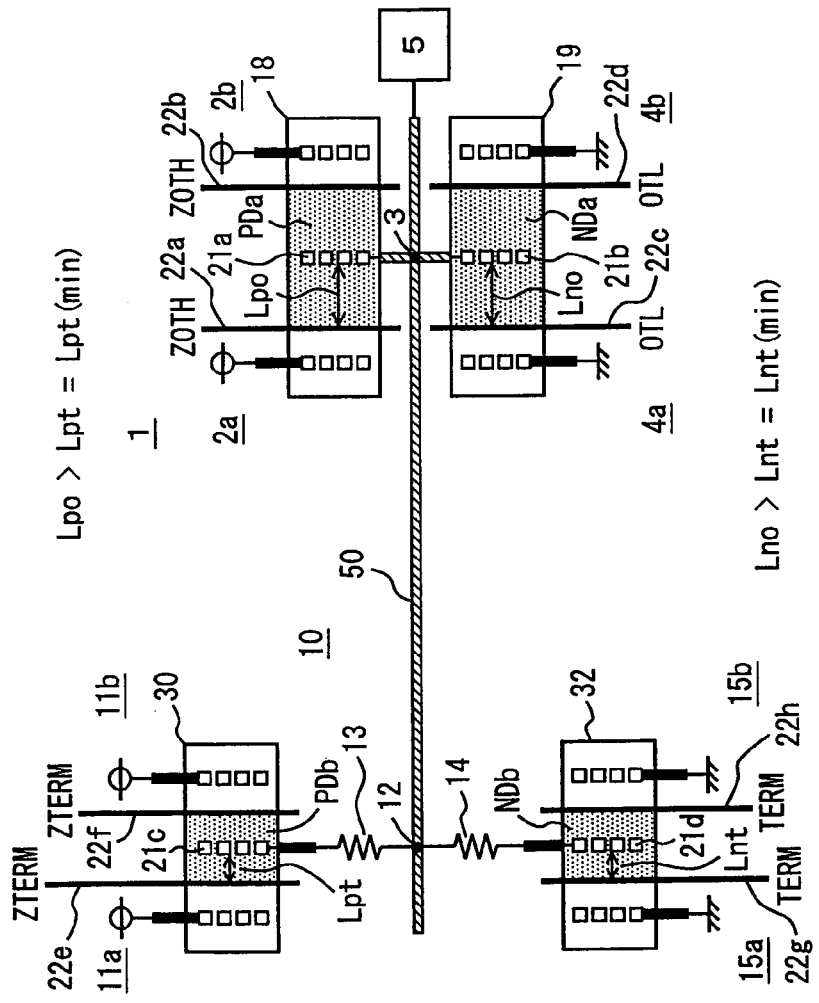
FIG. 10 schematically shows the two dimensional layout of the circuit shown in FIG. 9.

FIG. 10 schematically shows a configuration of layout of the semiconductor device shown in FIG. 9. In FIG. 10, output circuit 1 is arranged proximate to pad 5, and terminating circuit 10 is arranged far away from pad 5 as compared to output circuit 1. Termination node 12 of terminating circuit 10 and output node 3 of output circuit 1 are connected to pad 5 by common interconnection line 50.

Output circuit 1 includes P-type active region 18 for forming P-channel MOS transistors, and N-type active region 19 for forming N-channel MOS transistors, as in the first embodiment. In output circuit 1, a part that correspond to a component of output circuit 1 of the first embodiment shown in FIG. 2 is allotted an identical reference numeral or character, and detailed description thereof will not be repeated.

In P-type active region 18, the distances from drain contact 21a, formed in drain impurity region PDa, to gate electrode 22a and to gate electrode 22b each are Lpo. In N-type active region 19, the distances from drain contact 21b, formed in drain impurity region NDa, to gate electrode 22c and to gate electrode 22d each is Lpo. In FIG. 10, only one of the drain contact-to-gate distance for each active region is indicated. By setting the distances Lpo and Lno longer, the drain resistance is increased and the reliability against the surge generated at pad 5 can be assured.

The layout of terminating circuit 10 is identical to that of terminating circuit 10 shown in FIG. 2, except that it is arranged further away from pad 5 via interconnection line 50 as compared to output circuit 1. As for this terminating circuit 10, corresponding parts are allotted with identical reference numerals or characters, and detailed description thereof will not be repeated.

In P-type active region 30, the distances from drain contact 21c, formed in drain impurity region PDb, to gate electrodes 22e and 22f of MOS transistors 11a and 11b each are Lpt. In N-type active region 32, the distances between drain contact 21d, formed in drain impurity region NDb, and gate electrodes 22g and 22h of MOS transistors 15a and 15b, respectively, are each Lnt. As previously described, since termination node 12 is electrically connected to pad 5 via interconnection line 50 and output node 3, a parasitic low pass filter is connected equivalently to this termination node 12. Accordingly, the drain contact-to-gate electrode distances Lpt and Lnt are set to minimum design size of Lpt (min) and Lnt (min) on designing, respectively. Thus, the layout area of active regions 30 and 32 can be reduced, and hence the occupying area of terminating circuit 10 can further be reduced.

It should be noted that in the second embodiment also, it is not necessary to set Lpt and Lnt equal to each other, nor Lpo and Lno equal to each other.

First Modification

Figure 11:
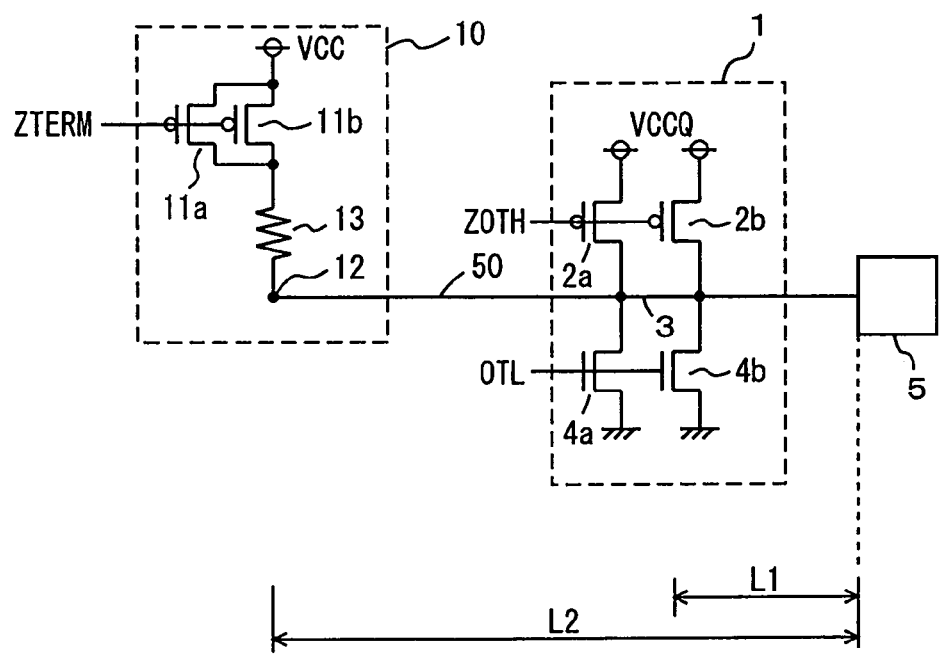
FIG. 11 shows the configuration of a first modification of the second embodiment of the present invention.

FIG. 11 shows a configuration of a first modification of the second embodiment of the present invention. In a semiconductor device shown in FIG. 11, terminating circuit 10 terminates the pad 5 at power supply voltage VCC. This termination voltage VCC is applied from a power supply terminal different from the terminal that applies power supply voltage VCCQ to output circuit 1. These voltages VCCQ and VCC may be at the same voltage level, or may be at different voltage levels.

Terminating circuit 10 includes resistance element 13 having one end connected to termination node 12, and P-channel MOS transistors 11a and 11b connecting the other end of resistance element 13 to a power supply node in accordance with termination control signal ZTERM.

In terminating circuit 10, no transistor terminating at ground is provided. The configuration of output circuit 1 is identical to that of output circuit 1 shown in FIG. 9, thus corresponding parts are allotted with identical reference numerals or characters, and detailed description thereof will not be repeated.

In the configuration shown in FIG. 11 also, termination node 12 of terminating circuit 10 is connected to pad 5 via output node 3 of output circuit 1 by interconnection line 50. Accordingly, the distance L2 from termination node 12 of terminating circuit 10 to pad 5 is sufficiently longer than the distance L1 between output node 3 of output circuit 1 and pad 5, similarly to the configuration shown in FIG. 9. In this interconnection line 50, the parasitic resistance and the parasitic capacitance thereof mitigate the surge abruptly inputted to the output pad 5, and additionally, terminating resistor 13 mitigates the surge voltage, and thus the steep voltage by the surge is changed to a moderate voltage. Accordingly, the drain contact-to-gate electrode distance of MOS transistors 11a and 11b in terminating circuit 10 is set sufficiently shorter than that of MOS transistors 2a and 2b in output circuit 1, and thus the drain resistances of the terminating MOS transistors are reduced.

Figure 12:
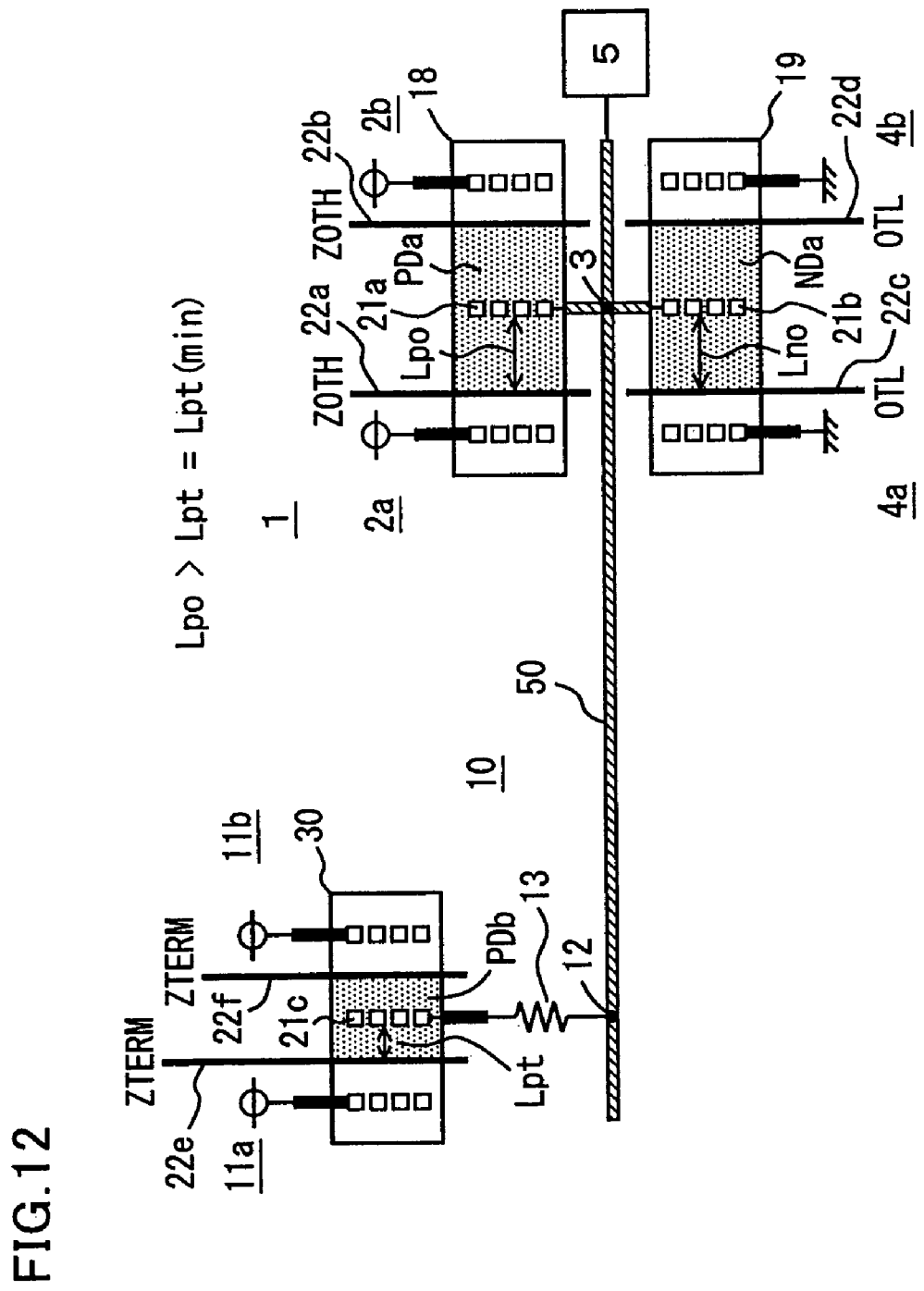
FIG. 12 schematically shows the two dimensional layout of the circuit shown in FIG. 11.

FIG. 12 schematically shows the layout of the semiconductor device shown in FIG. 11. The layout of the semiconductor device shown in FIG. 12 is identical to that of FIG. 10, except that resistance element 14 and N-type active region 32 is removed from terminating circuit 10. Accordingly, in the configuration shown in FIG. 12, the parts corresponding to the components shown in FIG. 10 are allotted with identical reference numerals or characters and detailed description thereof will not be repeated.

In this arrangement where terminating circuit 10 terminates by power supply, the drain contact-to-gate electrode distance Lpt is set sufficiently shorter than the drain contact-to-gate electrode distance Lpo of each of MOS transistors 2a and 2b of output circuit 1, and preferably, the distance Lpt is set to minimum design size Lpt (min). In this case, the distance Lpt is also set shorter than the drain contact-to-gate electrode distance Lno of each discharging MOS transistor in output circuit 1.

Accordingly, also in this the configuration where terminating circuit 10 terminates at power supply voltage VCC, interconnection line 50 has input capacitance of output circuit 1 as well as interconnection line capacitance and interconnection line resistance, and thus a low pass filter is formed, which mitigates the surge for transmission to terminating circuit 10. Even though the drain contact-to-gate electrode distance in terminating circuit 10 is set to minimum design size Lpt (min), since the surge is sufficiently mitigated and then transmitted, the reliability of these transistors 11a and 11b on occurrence of the surge can be sufficiently maintained.

Accordingly, the effect similar to that provided by the configurations shown in FIGS. 9 and 10 can be provided. Further, since terminating circuit 10 only terminates at power supply voltage VCC level and does not terminate at ground level, the occupying area of terminating circuit 10 can further be decreased. Terminating voltage VCC of terminating circuit 10 may be at an identical voltage level to power supply voltage VCCQ or may be at a different voltage level.

Second Modification

Figure 13:
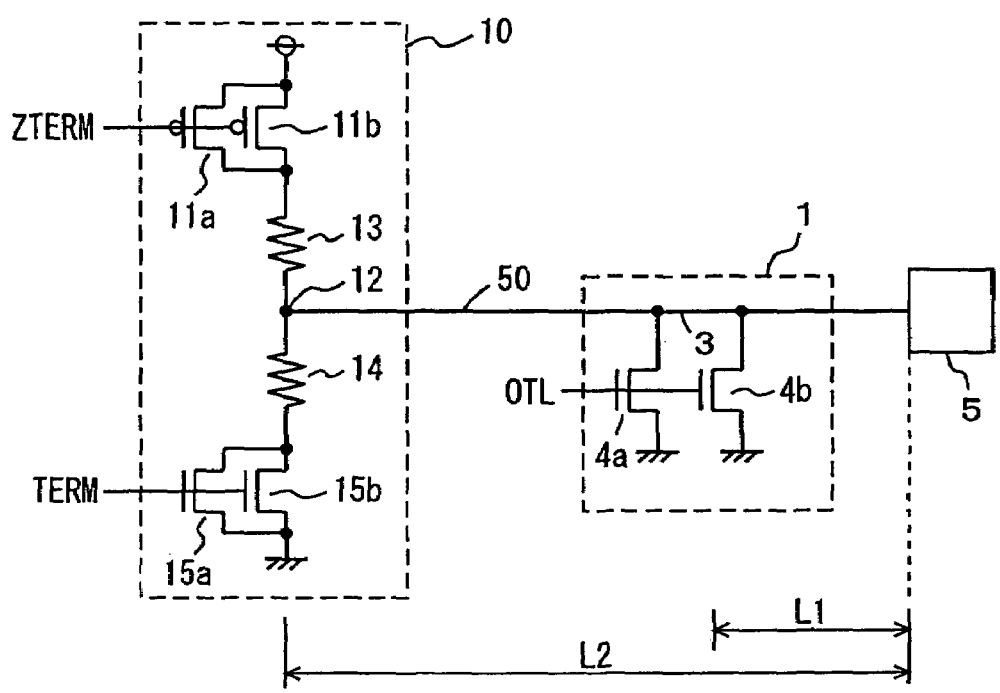
FIG. 13 shows the configuration of a second modification of the second embodiment of the present invention.

FIG. 13 shows a configuration of a second modification of the semiconductor device according to the second embodiment of the present invention. In the semiconductor device shown in FIG. 13, an output circuit of open-drain scheme that drives output node 3 to ground voltage level is employed as output circuit 1. Specifically, N-channel MOS transistors 4a and 4b that drives output node 3 to ground voltage level in accordance with output control signal OTL are provided in output circuit 1. No pulling up P-channel MOS transistors are provided in output circuit 1.

The configuration of terminating circuit 10 is identical to that of terminating circuit 10 shown in FIG. 9, therefore corresponding parts are allotted with identical reference numerals or characters, and detailed description thereof will not be repeated. Termination node 12 of this terminating circuit 10 is connected to pad 5 via output node 3 of output circuit 1 by interconnection line 50. The distance between termination node 12 and pad 5 is L2, while the distance between output node 3 and pad 5 is L1. Even though the surge is generated at pad 5, since transmission of the surge to terminating circuit 10 is made via interconnection line 50, the surge can be sufficiently mitigated and then transmitted to terminating circuit 10.

Accordingly, when output circuit 1 is an output circuit of open-drain scheme also, the input capacitance due to the drain junction capacitances of MOS transistors 4a and 4b and the parasitic capacitance of interconnection line 50 as well as the parasitic resistance of interconnection line 50 exists. Therefore, since a low pass filter is parasitically connected to termination node 12, the protection against the surge is established. Thus, these four MOS transistors 11a, 11b, 15a, and 15b do not require specific countermeasure against surge and their drain-to-gate electrode distances can be reduced, and the layout area of terminating circuit 10 can be reduced accordingly.

Figure 14:
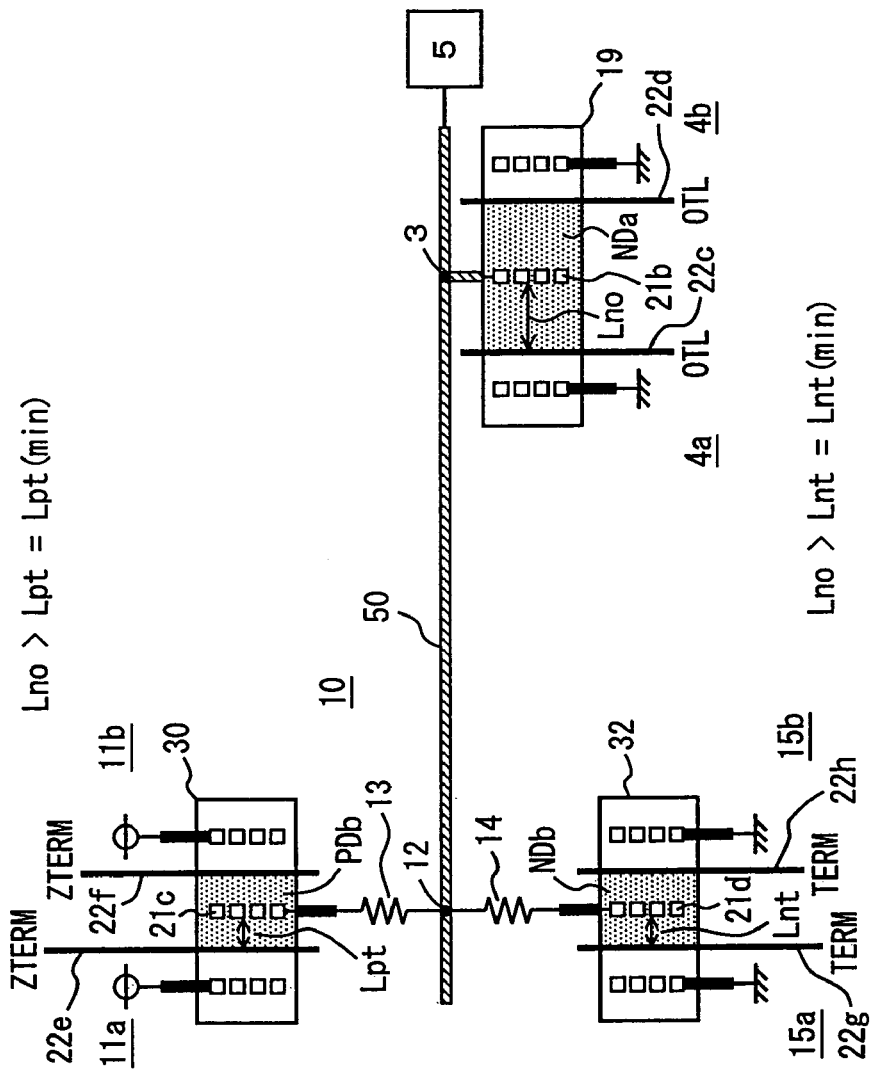
FIG. 14 schematically shows the two dimensional layout of the circuit shown in FIG. 13.

FIG. 14 schematically shows the layout of the semiconductor device shown in FIG. 13. The layout shown in FIG. 14 is identical to that shown in FIG. 11, except that P-type active region 15 is removed from output circuit 1, therefore corresponding parts are allotted with identical reference numerals or characters, and detailed description thereof will not be repeated.

In the layout shown in FIG. 14, the drain contact-to-gate electrode distance Lpt of each of P-channel MOS transistors 11a and 11b of terminating circuit 10 is set shorter than the drain contact-to-gate electrode distance Lno of each of MOS transistors 4a and 4b of the output circuit, and preferably set to the minimum design size Lpt (min). Similarly, the drain contact-to-gate electrode distance Lnt of each of MOS transistors 15a and 15b of terminating circuit 10 is set shorter than the drain contact-to-gate electrode distance Lno of each of MOS transistors 4a and 4b in output circuit 1, and preferably set to the minimum design size Lnt (min).

As shown explicitly in the layout in FIG. 14, the layout area of active regions 30 and 32 in terminating circuit 10 can be reduced, and the layout area is also reduced in output circuit 1, since only active region 19 is provided therein. Thus, an output circuit, driving the pad 5 in accordance with open-drain scheme at high speed with small occupying area, can be implemented. It should be noted that the ground voltage applied to terminating circuit 10 and the ground voltage applied to output circuit 1 may be applied from the same terminal, or may be from different terminals.

Third Modification

Figure 15:
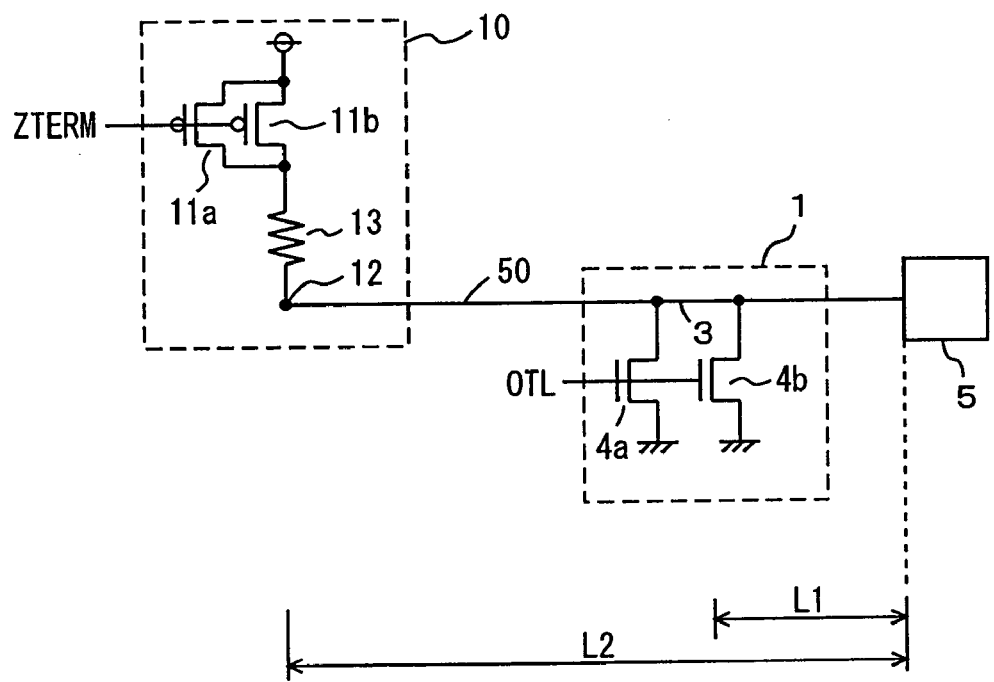
FIG. 15 schematically shows the configuration of a third modification of the second embodiment of the present invention.

FIG. 15 shows a configuration of a third modification of the second embodiment of the present invention. The configuration shown in FIG. 15 is different from the semiconductor device shown in FIG. 13 in the following points. MOS transistors 11a and 11b for terminating at power supply voltage and resistance element 13 connecting to termination node 12 are provided in terminating circuit 10. These MOS transistors 11a and 11b connect resistance element 13 to a power supply node in accordance with termination control signal ZTERM.

Output circuit 1 has identical configuration to that shown in FIG. 13, and includes N-channel MOS transistors 4a and 4b for driving the pad 5 to ground voltage level via output node 3 in accordance with output control signal OTL.

In the configuration shown in FIG. 15 also, termination node 12 of terminating circuit 10 is electrically connected to pad 5 via output node 3 by interconnection line 50. The distance L2 from termination node 12 to pad 5 and the distance L1 from output node 3 to pad 5 satisfy the relationship of L2>L2, and the surge is sufficiently mitigated by the parasitic low pass filter in interconnection line 50 before arrives at terminating circuit 10. Therefore, the drain contact-to-gate electrode distance of each of MOS transistors 11a and 11b in terminating circuit 10 can be set to the minimum size permissible on designing (minimum design size).

Figure 16:
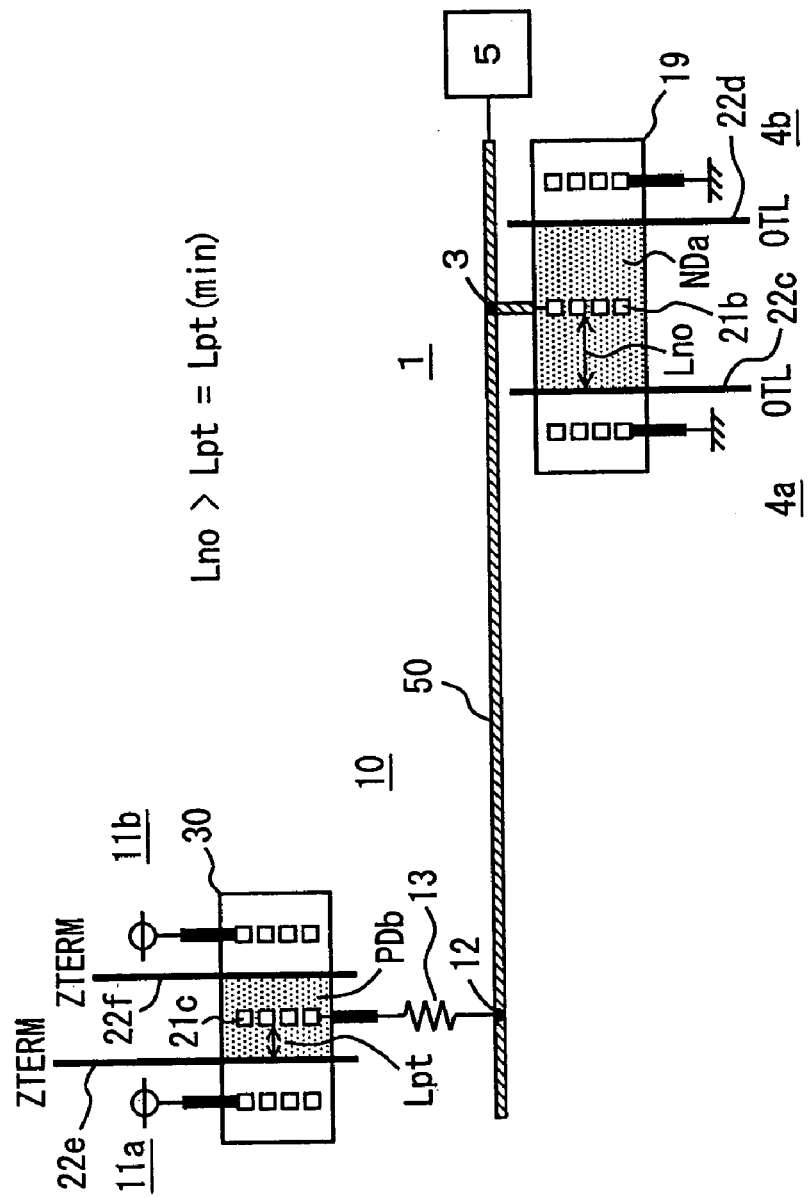
FIG. 16 schematically shows the two dimensional layout of the circuit shown in FIG. 15.

FIG. 16 schematically shows the layout of the semiconductor device shown in FIG. 15. The layout of the semiconductor device shown in FIG. 16 is different from that of the semiconductor device shown in FIG. 14 in the following points. Resistance element 14 and active region 32 are not provided in terminating circuit 10, and instead, resistance element 13 and P-type active region 30 are provided. The other configuration is the same as that shown in FIG. 14, thus corresponding parts are allotted with identical reference numerals or characters, and detailed description thereof will not be repeated.

In the layout shown in FIG. 16, the drain contact-to-gate electrode distance Lpt of each of P-channel MOS transistors 11a and 11b is set shorter than the drain contact-to-gate electrode distance Lno of each of P-channel MOS transistors 4a and 4b, and set to the minimum design size Lpt (min).

As shown in FIG. 16, terminating circuit 10 merely includes P-type active region 30 and resistance element 13, and thus its layout area is reduced. Similarly, output circuit 1 merely includes N-type active region 19 and correspondingly, its layout area is reduced. The only restriction for interconnection line 50 is that both of termination node 12 and output node 3 must be connected to interconnection line 50 while satisfying the condition L2>L1.

Figure 17:
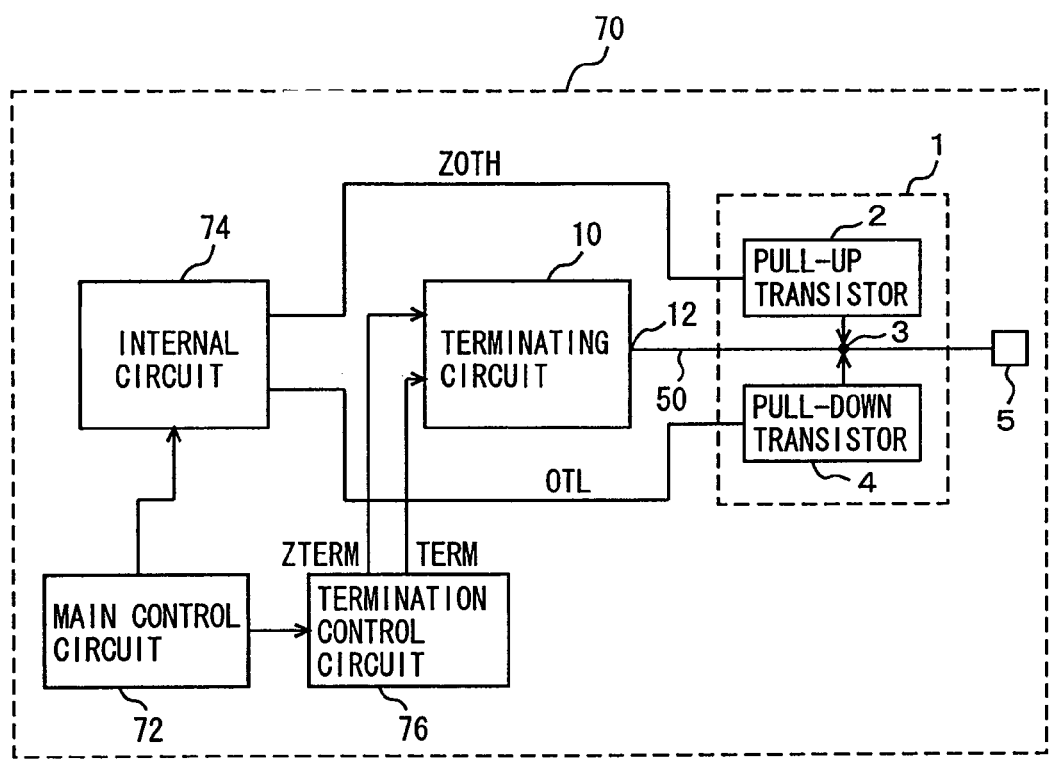
FIG. 17 schematically shows the overall configuration of a semiconductor device according to the present invention.

FIG. 17 schematically shows overall configuration of a semiconductor circuit device according to the present invention. In FIG. 17, a semiconductor circuit device 70 includes output circuit 1 for driving the pad 5 via output node 3 in accordance with output control signals ZOTH and OTL, and terminating circuit 10 for terminating the pad 5 at a prescribed voltage level via terminating node 12 in accordance with termination control signals ZTERM and TERM.

Output circuit 1 includes a pull-up transistor 2 for driving the output node 3 to power supply voltage level in accordance with output control signal ZOTH, and a pull-down transistor 4 for driving the output node 3 to ground voltage level in accordance with output control signal OTL. These pull-up transistor 2 and pull-down transistor 4 correspond to MOS transistors 2a, 2b and MOS transistors 4a, 4b as described in the first and second embodiments above, respectively. Terminating circuit 10 has the identical configuration to that shown in FIG. 9.

Semiconductor circuit device 70 further includes a main control circuit 72 for controlling various specified operations in accordance with an external control signal, an internal circuit 74 performing a prescribed processing operation under the control of main control circuit 72 to generate output control signals ZOTH and OTL, and a termination control circuit 76 for generating termination control signals ZTERM and TERM under the control of main control circuit 72.

When internal circuit 74 is a memory circuit, the output control signals ZOTH and OTL are generated through combination of an internal read data and an output control signal. When pad 5 is also used as an input pad for a signal input, then prescribed signal/data is applied to main control circuit 72 or internal circuit 74 via this pad 5. When the output pad and the input pad are provided separately, then signals/data are applied to main control circuit 72 and internal circuit 74 via input pads that are not shown, respectively.

Termination control circuit 76 changes the state of termination control signals ZTERM and TERM in accordance with the usage condition of the bus to which semiconductor circuit device 70 is connected.

As output circuit 1 shown in FIG. 17, open-drain type output circuit may be provided only with pull-down transistor 4. Terminating circuit 10 may have any of the configurations shown in FIGS. 9 to 16. To terminating circuit 10, power supply voltage and/or ground voltage may be applied via the same terminal as output circuit 1, or may be applied via different terminals.

As above, according to the second embodiment of the present invention, the terminating circuit and the output circuit are connected via the common interconnection line, with the terminating circuit arranged further away from the pad as compared to the output circuit. Accordingly, a low pass filter is formed by the parasitic capacitance and the parasitic resistance of the interconnection line, which serves to mitigate the surge. Thus, the drain resistance of the transistors in terminating circuit can be reduced, and the drain contact-to-gate electrode distance can be reduced down to the minimum design size. Accordingly, the layout area of the signal/data output portion can be reduced.

The distance from gate electrode to drain contact corresponds to the distance from a portion of connecting drain node and an internal node together to a contacting portion (interface portion) of the drain region and the channel region. Usually in MOS transistor, a drain high electric field is generated in a portion just under the gate electrode of the drain region. By adjusting the distance to the interface between the drain and the channel through which signal charges propagate, the drain high electric field on occurrence of the surge can be relaxed. Accordingly, the distance between the drain contact and the gate electrode is the distance when seen in two-dimensional layout.

In the above configurations, output circuits are constructed with MOS transistors. Even when the output circuit is constructed with bipolar transistors, the same effect can be achieved by replacing the drain with a collector of a bipolar transistor and the gate with a base of the bipolar transistor.

As above, according to the present invention, the distance between one conduction node and the control electrode of the terminating transistor is set shorter than the distance between one conduction node and the control electrode of the first output transistor driving the output node in accordance with an internal signal. Accordingly, the layout area of terminating circuit can be reduced, and the semiconductor device containing the terminating circuit can be implemented without increasing the layout area.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    a pad;
    an output circuit including a P channel MOS transistor connected between said pad and a first voltage node, and an N channel MOS transistor connected between said pad and a second voltage node; and
    a terminating circuit connected to said pad, and including a first terminating resistance element having one end connected to said pad, first and second P channel terminating unit transistors connected in parallel between another end of said first terminating resistance element and said first voltage node and sharing a first drain impurity region coupled to the other end of said first terminating resistance element, a second terminating resistance element having one end connected to said pad, and first and second N channel terminating unit transistors connected in parallel between another end of said second terminating resistance element and said second voltage node and sharing a second drain impurity region coupled to the other end of said second terminating resistance element.

2. The semiconductor device according to claim 1, wherein
    a distance between each gate of the first and second P channel terminating unit transistors and a drain contact connected to the shared first drain impurity region is shorter than a distance between a gate and a drain contact of said first P channel MOS transistor, and
    a distance between each gate of the first and second N channel terminating unit transistors and a drain contact connected to the shared second drain impurity region is shorter than a distance between a gate and a drain contact of said first N channel MOS transistor.

3. The semiconductor device according to claim 1, wherein
    the P channel MOS transistor comprises first and second P channel MOS unit transistors connected in parallel with each other and sharing a third drain impurity region, and
    the N channel MOS transistor comprises first and second N channel MOS unit transistors connected in parallel with each other and sharing a fourth drain impurity region.

4. The semiconductor device according to claim 3, wherein
    a distance between each gate of the first and second P channel terminating unit transistors and a drain contact connected to the shared first drain impurity region is shorter than a distance between each gate of the first and second P channel MOS unit transistors and a drain contact connected to the shared third drain impurity region, and
    a distance between each gate of the first and second N channel terminating unit transistors and a drain contact connected to the shared second drain impurity region is shorter than a distance between each gate of the first and second N channel MOS unit transistors and a drain contact connected to the shared fourth drain impurity region.

5. A semiconductor device comprising:
    a memory circuit;
    a pad being used for outputting data read from said memory circuit;
    a first N channel transistor pulling-down an output signal delivered to the pad in accordance with the read data, and having a first impurity region to be supplied with a first voltage, a second impurity region coupled to said pad via a first contact disposed thereon, and a first gate electrode disposed between the first impurity region and the second impurity region; and
    a terminating circuit connected to the pad and being activated by a terminating operation activating signal and which includes a first terminating resistance element connected to said pad and a first P channel transistor having third and fourth impurity regions to be supplied with a second voltage, a fifth impurity region provided between the third impurity region and the fourth impurity region and coupled to said first terminating resistance element via a second contact disposed thereon, a second gate electrode disposed between the third impurity region and the fifth impurity region, and a third gate electrode disposed between the fourth impurity region and the fifth impurity region in parallel with said second gate electrode, said second gate electrode and said third gate electrode receiving the terminating operation activating signal, a first distance between said second contact and said second gate electrode being shorter than a second distance between said first contact and said first gate electrode.

6. The semiconductor device according to claim 5, wherein
the first distance and the second distance are the distance in the two dimensional layout.

7. The semiconductor device according to claim 5, wherein
a third distance between said second contact and said third gate electrode is shorter than the second distance.

8. The semiconductor device according to claim 5, further comprising a second P channel transistor pulling-up said output signal delivered to the pad in accordance with the read data, and having a first impurity region of the second P channel transistor to be supplied with a third voltage, a second impurity region of the second P channel transistor coupled to said pad via a third contact disposed thereon, and a first gate electrode of the second P channel transistor disposed between the first and the second impurity region of the second P channel transistor; and
wherein the terminating circuit includes a second terminating resistance element connected to said pad and a second N channel transistor having third and fourth impurity regions of the second N channel transistor to be supplied with a fourth voltage, a fifth impurity region of the second N channel transistor provided between the third impurity region and the fourth impurity region of the second N channel transistor and coupled to said second terminating resistance element via a fourth contact disposed thereon, a second gate electrode of the second N channel transistor disposed between the third impurity region and the fifth impurity region of the second N channel transistor, and a third gate electrode of the second N channel transistor disposed between the fourth impurity region and the fifth impurity region of the second N channel transistor in parallel with said second gate electrode of the second N channel transistor, said second gate electrode and said third gate electrode of the second N channel transistor receiving a terminating operation activating signal, a third distance between said fourth contact and said second gate electrode of said second N channel transistor being shorter than said second distance.

9. The semiconductor device according to claim 8, wherein
a fourth distance between said second contact and said third gate electrode of said first P channel transistor being shorter than a fifth distance between said third contact and said first gate electrode of said second P channel transistor.

10. The semiconductor device according to claim 9, further comprising:
a first power supply terminal supplying the first voltage and the fourth voltage; and
a second power supply terminal supplying the second voltage and the third voltage.

11. The semiconductor device according to claim 8, further comprising a first area and a second area which sandwich a virtual straight line which is located so as to pass on the pad,
wherein the first P channel transistor and the second P channel transistor are arranged in the first area, and the first N channel transistor and the second N channel transistor are arranged in the second area.

\* \* \* \* \*

(12) EX PARTE REEXAMINATION CERTIFICATE (8366th)
United States Patent
Kubo

(10) Number: US 7,116,128 C1
(45) Certificate Issued: Jun. 28, 2011

(54) SEMICONDUCTOR DEVICE WITH BUS TERMINATING FUNCTION

(75) Inventor: Takashi Kubo, Hyogo (JP)

(73) Assignee: Renesas Electronics Corporation, Shimonumabe, Nakaharu-Ku, Kawasaki-Shi, Kanagawa (JP)

Reexamination Request:
No. 90/009,830, Sep. 24, 2010

Reexamination Certificate for:
Patent No.: 7,116,128
Issued: Oct. 3, 2006
Appl. No.: 11/212,743
Filed: Aug. 29, 2005

Related U.S. Application Data

(63) Continuation of application No. 10/391,021, filed on Mar. 19, 2003, now Pat. No. 7,106,092.

(51) Int. Cl.
*H03K 17/16* (2006.01)

(52) U.S. Cl. .......................... 326/30; 326/87
(58) Field of Classification Search ............... 326/30
See application file for complete search history.

(56) References Cited

U.S. PATENT DOCUMENTS

| | | | |
|---|---|---|---|
| 4,859,877 A | 8/1989 | Cooperman | |
| 4,990,802 A | 2/1991 | Smooha | |
| 5,023,488 A | 6/1991 | Gunning | |

(Continued)

FOREIGN PATENT DOCUMENTS

| | | |
|---|---|---|
| JP | 3-228858 | 10/1991 |
| JP | 07-277576 | 5/1997 |
| JP | 2003-283322 | 10/2003 |
| JP | 2004-146485 | 5/2004 |

OTHER PUBLICATIONS

Beebe, Stephen G., "Characterization, Modeling and Design of ESD Protection Circuits", Chapter 2–ESD Circuit Characterization and Design Issues, Mar. 1998, pp. 37–53.

Ismail, M. et al, "Analog VLSI Signal and Information Processing", Chapter 16 Analog and Mixed Analog–Digital Layout, 1994, pp. 699–726, McGraw–Hill, Inc. USA, no date.

Weste, N. et al., "Principles of CMOS VLSA Design A Systems Perspective", 5.3 Electrical and Physical Design of Logic Gates, 5.3.5 Source–drain capacitance, 1985, pp. 185–186, Addison–Wesley VISI Systems Series, no month.

Dabral, S., "Basic ESD and I/O Design", A Wiley Interscience Publication, John Wily & sons, Inc., pp. 10–12 and pp. 183–190, 1998, USA, no month.

Duvvury, C., et al., "ESD Protection Reliability in 1 μM CMOS Technologies", Semiconductor Advanced Development, 1986, pp. 199–205, no month.

Dingwall, A., "C2L: A New High–Speed High–Density Bulk CMOS Technology", IEEE Journal of Solid–State Circuits, vol. SC–12, No. 4, Aug. 1977, pp. 344–349.

Duvvury, C., et al, "ESD Phenomena and Protection Issues in CMOS Output Buffers" IEEE/IRPS, 1997, pp. 174–180, no month.

Duvvury, C., et al, "ESD Protection: Design and Layout Issues for VLSI Circuits", IEEE Transactions on Industry Applications, vol. 25, No. 1, Jan./Feb. 1989, pp. 41–47, no month.

(Continued)

*Primary Examiner*—Sudhanshu C. Pathak

(57) ABSTRACT

The distance between a drain contact and gate electrode in a terminating transistor, which couples a termination resistor connected to an output terminal to a power source node, is set shorter than in an output transistor, which drives an output node in accordance with an internal signal. The area of the terminating circuit is reduced while the reliability against the surge is maintained. Thus, an output circuit containing the terminating circuit that occupies a small area and is capable of transmitting a signal/data at high speed is provided.

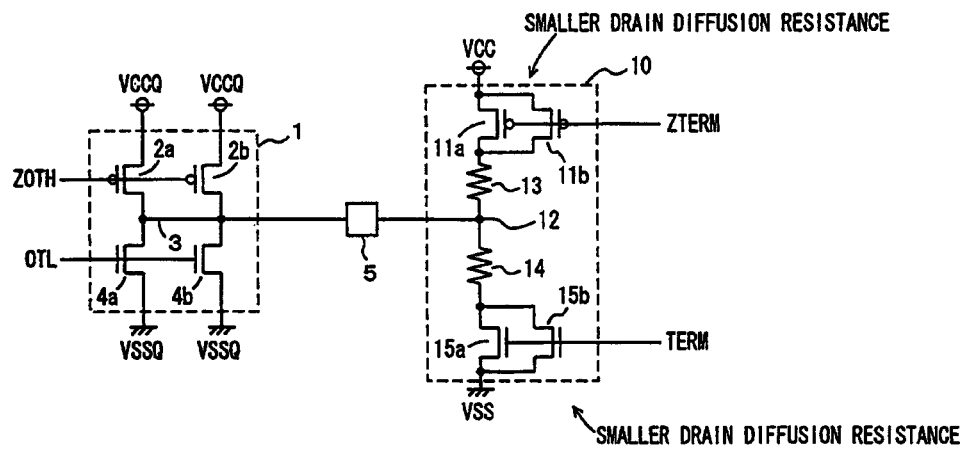

U.S. PATENT DOCUMENTS

| | | |
|---|---|---|
| 5,438,281 A | 8/1995 | Takahashi et al. |
| 5,440,163 A | 8/1995 | Ohhashi et al. |
| 5,493,142 A | 2/1996 | Randazzo |
| 5,705,941 A | 1/1998 | Fukazawa |
| 5,726,583 A | 3/1998 | Kaplinsky |
| 5,729,152 A | 3/1998 | Leung |
| 5,731,614 A | 3/1998 | Ham |
| 5,731,711 A | 3/1998 | Gabara |
| 5,744,839 A | 4/1998 | Ma et al. |
| 5,867,418 A | 2/1999 | Okasaka et al. |
| 5,949,252 A | 9/1999 | Taguchi |
| 6,026,456 A | 2/2000 | Ilkbahar |
| 6,031,704 A | 2/2000 | Jeong |
| 6,054,881 A | 4/2000 | Stoenner |
| 6,239,619 B1 | 5/2001 | Yuan et al. |
| 6,323,689 B1 | 11/2001 | Morishita |
| 6,329,837 B1 | 12/2001 | Whitworth |
| 6,331,787 B1 | 12/2001 | Whitworth et al. |
| 6,356,102 B1 | 3/2002 | Klein |
| 6,356,106 B1 | 3/2002 | Greeff |
| 6,424,169 B1 | 7/2002 | Partow |
| 6,501,108 B1 | 12/2002 | Suzuki |
| 6,541,824 B2 | 4/2003 | Lee |
| 6,545,322 B2 | 4/2003 | Ishii |
| 6,552,372 B2 | 4/2003 | Wu |
| 6,583,972 B2 | 6/2003 | Verhaege et al. |
| 6,642,742 B1 | 11/2003 | Loyer |
| 6,714,039 B2 | 3/2004 | Salcido et al. |
| 6,720,795 B2 | 4/2004 | Partow et al. |
| 6,754,132 B2 | 6/2004 | Kyung |
| 6,759,874 B2 | 7/2004 | Braun |
| 6,777,976 B2 | 8/2004 | Kuge |
| 6,809,546 B2 | 10/2004 | Song et al. |
| 6,853,213 B2 | 2/2005 | Funaba et al. |
| 6,924,669 B2 | 8/2005 | Itoh et al. |
| 6,927,600 B2 | 8/2005 | Choe |
| 6,967,500 B1 | 11/2005 | Lin et al. |
| 2005/0007150 A1 | 1/2005 | Omote |
| 2005/0046441 A1 | 3/2005 | Braceras |
| 2005/0194991 A1 | 9/2005 | Dour |

OTHER PUBLICATIONS

JEDEC Publishes DDR2 Standard, JEDEC Sep. 12, 2003, Arlington, VA.

JEDEC Standard "Double Data Rate (DDR) SDRAM Specification", JESD79E, (revision of JESD79D), May 2005.

JEDEC Standard "DDR2 SDRAM Specification" JESD79–2C (revision of JESD79–2B), May 2006.

Minutes of Meeting No. 100, JC–42.3 Committee on DRAM Memories, Sep. 12–13, 2001, Las Vegas, Nevada, pp. 1–17.

Minutes of JC–42 Interim Meeting, Oct. 23–24, 2001, Sacramento, CA, pp. 1–11, no date, month.

Minutes of Meeting No. 101, JC–42.3, Committee on RAM Memories, Dec. 5–7, 2001, Honolulu, Hawaii, pp. 1–27.

DDRII 533MT/s, Comparative Study of DDR–II termination, DDR–II signal Integrity Simulation Results, JC42.3 & 42.5 DDR–II, Oct. 22, 2001, Samsung Electronics, 45 pages.

"Proposal to Add Active Termination to DDRII (Results of Task Group)", Item 1291, JEDEC Second Showing, Dec. 2001, pp. 1–8.

"The JEDEC Patent Policy" JEDEC, SAM 0680054, pp. 1–2, no date, month, year.

JEDEC Patent Policy, Posted Jun. 20, 2003.

"JEDEC Manual of Organization and Procedure", JEDEC Manual, JM21M (revision of JM21L, Jul. 2002) Dec. 2008, 35 pages.

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-11 is confirmed.

\* \* \* \* \*